(12) United States Patent
Hayashida

(10) Patent No.: US 6,953,709 B2
(45) Date of Patent: Oct. 11, 2005

(54) SEMICONDUCTOR DEVICE AND ITS MANUFACTURING METHOD

(75) Inventor: Tetsuya Hayashida, Hinode (JP)

(73) Assignees: Renesas Technology Corp., Tokyo (JP); Renesas Northern Japan Semiconductor, Inc., Hokkaido (JP)

(*) Notice: Subject to any disclaimer, the term of this patent is extended or adjusted under 35 U.S.C. 154(b) by 74 days.

(21) Appl. No.: 10/484,191

(22) PCT Filed: Apr. 18, 2002

(86) PCT No.: PCT/JP02/03868
§ 371 (c)(1),
(2), (4) Date: Jan. 20, 2004

(87) PCT Pub. No.: WO03/012863
PCT Pub. Date: Feb. 13, 2003

(65) Prior Publication Data
US 2004/0171193 A1 Sep. 2, 2004

(30) Foreign Application Priority Data
Jul. 31, 2001 (JP) .................................. 2001-231770

(51) Int. Cl.$^7$ .......................... H01L 21/44; H01L 21/50
(52) U.S. Cl. ...................................... 438/118; 438/125
(58) Field of Search .............................. 438/106, 108, 438/118, 125, 612

(56) References Cited

U.S. PATENT DOCUMENTS 5,786,271 A * 7/1998 Ohida et al. ............... 438/615
6,046,495 A    4/2000 Urushima ................... 257/668

FOREIGN PATENT DOCUMENTS

| JP | 9-223759 | 8/1997 |
|---|---|---|
| JP | 10-70211 | 3/1998 |
| JP | 10-74795 | 3/1998 |
| JP | 11-261044 | 9/1999 |
| JP | 11-307594 | 11/1999 |
| JP | 2000-58594 | 2/2000 |
| JP | 2001-168152 | 6/2001 |

\* cited by examiner

Primary Examiner—Michael Lebentritt
Assistant Examiner—Scott Geyer
(74) Attorney, Agent, or Firm—Miles & Stockbridge P.C.

(57) ABSTRACT

A semiconductor device having area array bump electrodes suitable for flip chip packaging is disclosed. A semiconductor chip with wire bonding electrodes arranged along peripheral edges thereof is provided, then gold wire bump electrodes are formed over the wire bonding electrodes, and thereafter a wiring tape substrate is superimposed on the semiconductor chip and is bonded thereto with an adhesive. On a back surface of the wiring tape substrate are formed wiring connections correspondingly to the electrodes. Further, at the time of bonding with use of the adhesive, convex tips of the gold wire bump electrodes formed respectively on the electrodes of the semiconductor chip pierce through the adhesive to connect the gold wire bump electrodes and the connections electrically with each other. On a surface of the wiring tape substrate are formed area array bump electrodes, whose pitch is larger than the pitch of the electrodes formed on the semiconductor chip.

3 Claims, 18 Drawing Sheets

SEMICONDUCTOR DEVICE AND ITS MANUFACTURING METHOD

FIELD OF ART

The present invention relates to a semiconductor device and a method of manufacturing the same. Particularly, the present invention is concerned with a technique which can convert a semiconductor chip having wire bonding electrodes on a surface thereof into a semiconductor device having area array bump electrodes capable of being flip chip packaged.

BACKGROUND ART

Recently, in electronic devices with a semiconductor device incorporated therein, not only there has been a tendency to high speed, high function, and high packaging density, but also efforts have been made for the reduction of thickness and weight. Particularly, flip chip packaging of a semiconductor chip (semiconductor element) with LSI, etc. incorporated therein is effective for the attainment of high speed and thickness reduction.

Flip chip packaging methods are broadly classified into the following two methods. (1) Gold stud bumps are formed on peripheral electrodes (e.g., aluminum electrodes) of a semiconductor chip by the wire bonding method and thereafter the gold stud bumps (gold salient electrodes) are bonded to a mounting substrate through a thermosetting resin such as ACF (Anisotropic Conductive Film) or NCF (Non Conductive Film), or the gold stud bumps and wiring lines (leads) on a mounting substrate are connected together using solder, followed by sealing with an insulating resin. (2) There is adopted a WPP (Wafer Process Package) method wherein film forming and patterning steps are repeated for a wafer in the manufacture of a semiconductor chip to form a re-wiring layer which provides connection between peripheral electrodes on the semiconductor chip and lands for solder electrodes arranged in a lattice shape, and solder bump electrodes are formed on the lands for solder electrodes. After subsequent division into individual chips, each of the chips is connected to a substrate through the solder bump electrodes.

The above flip chip packaging methods give rise to the following problems. For preventing signal delay caused by an increase of the wiring length, peripheral electrodes on a semiconductor chip are arranged along an area where input/output circuit elements of the semiconductor chip are formed, so are generally arranged at a small spacing (pitch) in a narrow area on a main surface of the semiconductor chip. Therefore, in the above method (1) wherein bump electrodes are formed directly on the peripheral electrodes of the semiconductor chip, the pitch of the bump electrodes thus formed is small and it is accordingly required to use a build-up type packaging substrate which is more expensive than the ordinary type of packaging substrates.

In the above method (2), by forming a re-wiring layer, it becomes possible to arrange lands for solder electrodes in a lattice shape of plural rows and columns over a wide main surface of a semiconductor chip, so that the spacing between adjacent solder bump electrodes also becomes wider. However, since the manufacturing process is applied, including defective ships in a state of wafer, an increase of cost results, and it is difficult to form a mechanism for relaxing a thermal stress which is induced between the packaging substrate and the semiconductor chip in the foregoing WPP method.

As the packaging substrate for the semiconductor device there generally is employed a ceramic substrate or a printed substrate. In these packaging substrates, the pitch of electrodes for connection with the semiconductor device is about 130 to 160 $\mu$m, thus making it impossible to connect them with peripheral electrodes on the semiconductor chip side having a pitch of 80 to 100 $\mu$m directly by flip chip bonding.

For the printed substrate, therefore, there usually is adopted a build-up method capable of forming fine electrodes, as a substitute for the conventional laminate method.

However, the build-up method is more complicated in the manufacturing process than the laminate method and the resulting substrate is 1.7 to 2 times more expensive than the substrate obtained by the laminate method.

Therefore, the present inventor has studied changing electrodes on the semiconductor chip side from peripheral electrodes to area array bump electrodes arranged in a lattice shape of plural rows and columns on a main surface of a semiconductor wafer to widen the electrode pitch and thereby permit the use of a printed substrate fabricated by the less expensive laminate method. On the basis of this study the present inventor accomplished the present invention.

In Japanese Unexamined Patent Publication No. 2000-58594 there is disclosed a semiconductor device having a structure wherein a semiconductor chip is mounted through an adhesive onto a tape as a bump substrate having plural solder balls for substrate packaging and wherein grooves are formed in the tape surface where the solder balls are formed, allowing stress to be dispersed by the grooves.

It is an object of the present invention to provide a semiconductor device having area array bump electrodes suitable for flip chip packaging and a method of manufacturing the same.

It is another object of the present invention to provide inexpensively a semiconductor device having area array bump electrodes suitable for flip chip packaging.

It is a further object of the present invention to provide a semiconductor device having a stress relaxing structure between bump electrodes arranged in a lattice shape and a semiconductor chip, and a method of manufacturing the same.

The above and other objects and novel features of the present invention will become apparent from the following description and the accompanying drawings.

DISCLOSURE OF THE INVENTION

Typical modes of the invention disclosed herein will be outlined below.

(1) A semiconductor device comprising:
a semiconductor chip, the semiconductor chip having a main surface, a plurality of semiconductor elements formed on the main surface, and a plurality of electrodes;
gold salient electrodes (gold wire bump electrodes) formed respectively on the electrodes of the semiconductor chip;
a wiring substrate (wiring tape substrate), the wiring substrate having an insulating base layer (tape base) provided with a main surface and a back surface, a plurality of wiring lines formed on the main surface of the insulating base layer, and through holes formed in the insulating base layer; and
a plurality of solder salient electrodes (area array bump electrodes) formed on the main surface of the wiring substrate and connected respectively to the plural wiring lines, wherein the wiring substrate is disposed in such a manner that the back surface of the insulating base layer is opposed to the main surface of the semiconductor chip, wherein the back surface of the insulating base layer and the main surface of the semiconductor chip are bonded with each other through an adhesive (a thermosetting resin), wherein the gold salient electrodes are connected respectively to the wiring lines of the wiring substrate in the interiors of the through holes, wherein the plural solder salient electrodes are arranged in a lattice shape of plural rows and columns at a pitch larger than a minimum pitch of the electrodes of the semiconductor chip, and wherein the solder salient electrodes are arranged on the main surface of the semiconductor chip through the adhesive and the insulating base layer.

The sum of the thickness of the insulating base layer and the thickness of the adhesive is in the range of 50 to 100 $\mu$m. The thickness of the insulating base layer is larger than the thickness (below 50 $\mu$m) of the adhesive. The plural wiring lines are formed by a copper film and an Sn or NI—Au plating film formed on a surface of the copper film. The electrodes of the semiconductor chip are arranged along a peripheral portion of the main surface of the semiconductor chip. The electrodes of the semiconductor chip are arranged along an area where input/output circuit elements are formed. The solder salient electrodes are arranged in areas deviated from the areas where the gold salient electrodes are formed. The elastic modulus of the gold salient electrodes is higher than the elastic moduli of the insulating base layer and the adhesive. The insulating base layer is constituted by a flexible film (a polyimide resin).

The semiconductor device constructed as above is manufactured by a method comprising the steps of:

providing a semiconductor chip, the semiconductor chip having a main surface, a plurality of semiconductor elements formed on the main surface, and a plurality of electrodes;

providing a wiring substrate, the wiring substrate having an insulating base layer provided with a main surface and a back surface, a plurality of wiring lines formed on the main surface of the insulating base layer, and through holes formed in the insulating base layer;

forming gold salient electrodes respectively on the electrodes of the semiconductor chip;

disposing the wiring substrate onto the main surface of the semiconductor chip through an adhesive (a thermosetting resin) interposed between the back surface of the insulating base layer and the main surface of the semiconductor chip;

thereafter, applying pressure to the wiring substrate to bring the gold salient electrodes and the wiring lines into mutual contact in the interiors of the through holes, and applying heat to the adhesive to let the adhesive cure; and forming a plurality of solder salient electrodes on the main surface of the wiring substrate in such a manner that the solder salient electrodes are connected to the plural wiring lines, wherein the plural solder salient electrodes are arranged in lattice shape of plural rows and columns at a pitch larger than a minimum pitch of the electrodes of the semiconductor chip, and wherein the solder salient electrodes are arranged on the main surface of the semiconductor chip through the adhesive and the insulating base layer.

According to the above means (1) there accrue the following advantages.

(a) The wire bonding electrodes arranged along the peripheral edges of a semiconductor chip can be made into solder bump electrodes of a larger pitch than the pitch of the wire bonding electrodes with use of a wiring substrate, so that electric characteristics can be improved. Particularly, the inductance which is essential to high-speed signal processing can be decreased to about 0.1 nH from that in the wire bonding method which is 1 to 1.5 nH.

(b) By making the wire bonding electrodes into solder salient electrodes having a wider pitch than the pitch of the wire bonding electrodes and larger than the wire bonding electrodes, it is possible to enhance the connection reliability in packaging the semiconductor device.

(c) Since the wiring substrate with solder salient electrodes formed thereon is of the same size as the semiconductor chip and is superimposed on the semiconductor chip in registration with the chip, it is possible to attain the reduction in size of the semiconductor device.

(d) The solder salient electrodes are arranged in areas deviated from the areas where the gold salient electrodes are arranged. Further, the elastic modulus of the gold salient electrodes is higher than the elastic moduli of the insulating base layer and the adhesive. Therefore, the solder salient electrodes are arranged on the main surface of the semiconductor chip through the insulating base layer lower in elastic modulus than the gold salient electrodes and through the adhesive after curing, whereby when the chip is mounted on a packaging substrate, a thermal stress induced by a difference in thermal expansion coefficient between the semiconductor chip and the packaging substrate can be relaxed by both insulating base layer and adhesive.

(e) Between the solder salient electrodes arranged on the main surface of the semiconductor chip and the semiconductor chip there is formed a layer of 50 to 100 $\mu$m or more in thickness by an organic resin of a low elastic modulus, whereby a thermal stress induced between the packaging substrate and the semiconductor chip is relaxed.

(f) If an attempt is made to form an adhesive layer at a thickness of 50 $\mu$m or more with use of a thermosetting resin such as ACF or NCF, there arises the problem that the flatness of solder salient electrodes formed thereon is deteriorated due to partial variations in thickness which occur in a heat hardening step. However, according to the present invention, an insulating base layer is disposed between the solder salient electrodes and the semiconductor chip while restricting the thickness of the adhesive layer to a value of not larger than 50 $\mu$m, whereby it is possible to so much increase the thickness between the solder salient electrodes and the semiconductor chip. As a result, it is possible to prevent the deterioration in flatness of the solder salient electrodes.

(g) Since the insulating base layer is formed by a flexible resin film and its thickness is about 30 to 100 $\mu$m, the stress after the mounting of the semiconductor device onto the packaging substrate is relaxed and the packaging reliability is enhanced.

BEST MODE FOR CARRYING OUT THE INVENTION

Figure 1:
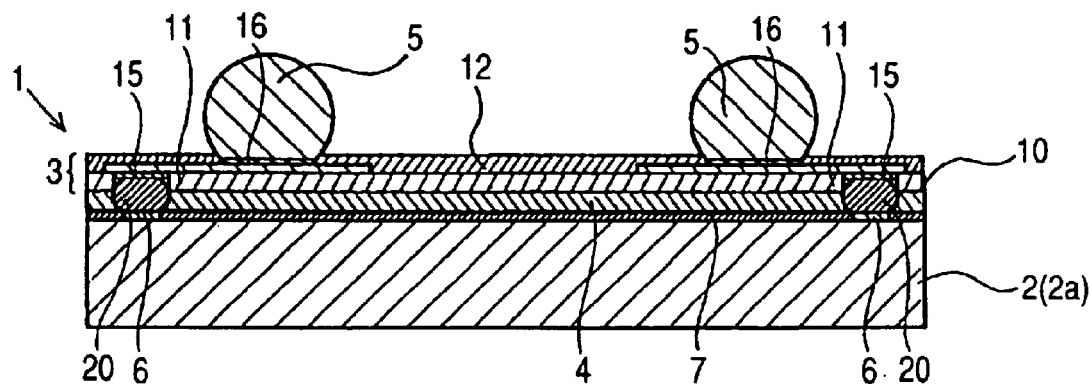
FIG. 1 is a schematic sectional view showing a semiconductor device according to one embodiment (first embodiment) of the present invention.

Embodiments of the present invention will be described in detail hereinunder with reference to the accompanying drawings. In all of the drawings for illustrating the embodiments of the invention, portions having the same functions are identified by like reference numerals, and repeated explanations thereof will be omitted.

(First Embodiment)

Figure 2:
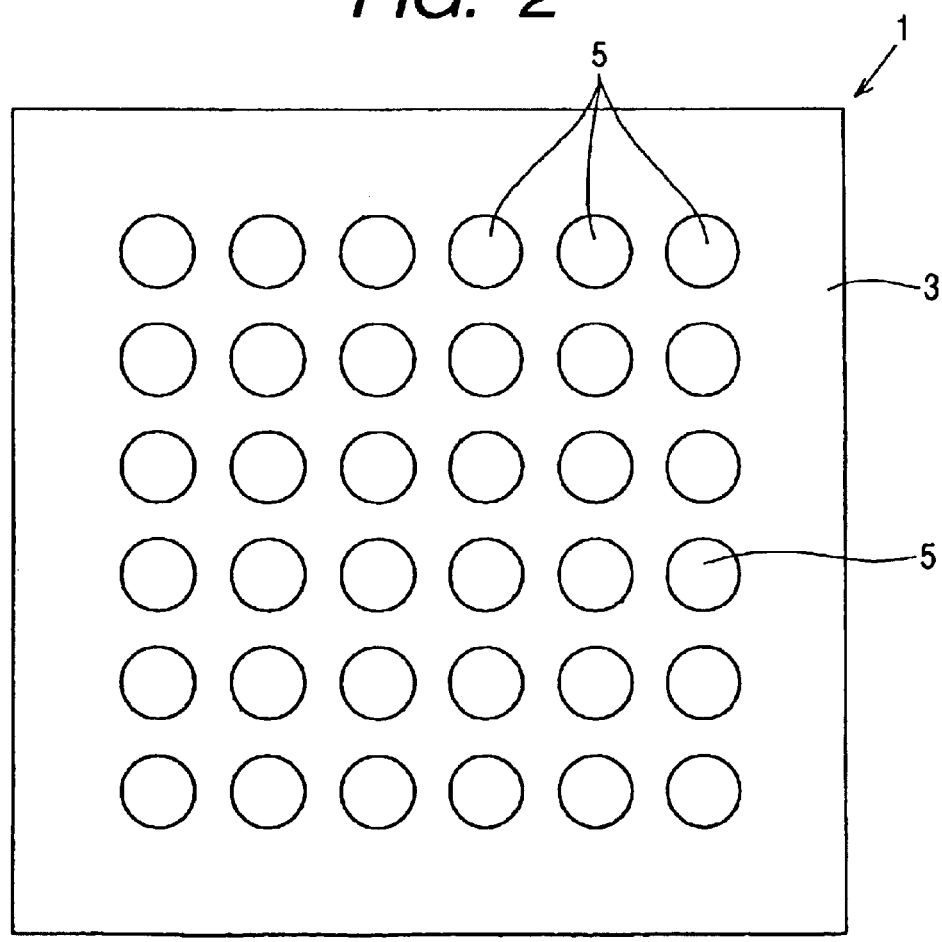
FIG. 2 is a plan view of the semiconductor device of the first embodiment.
Figure 3:
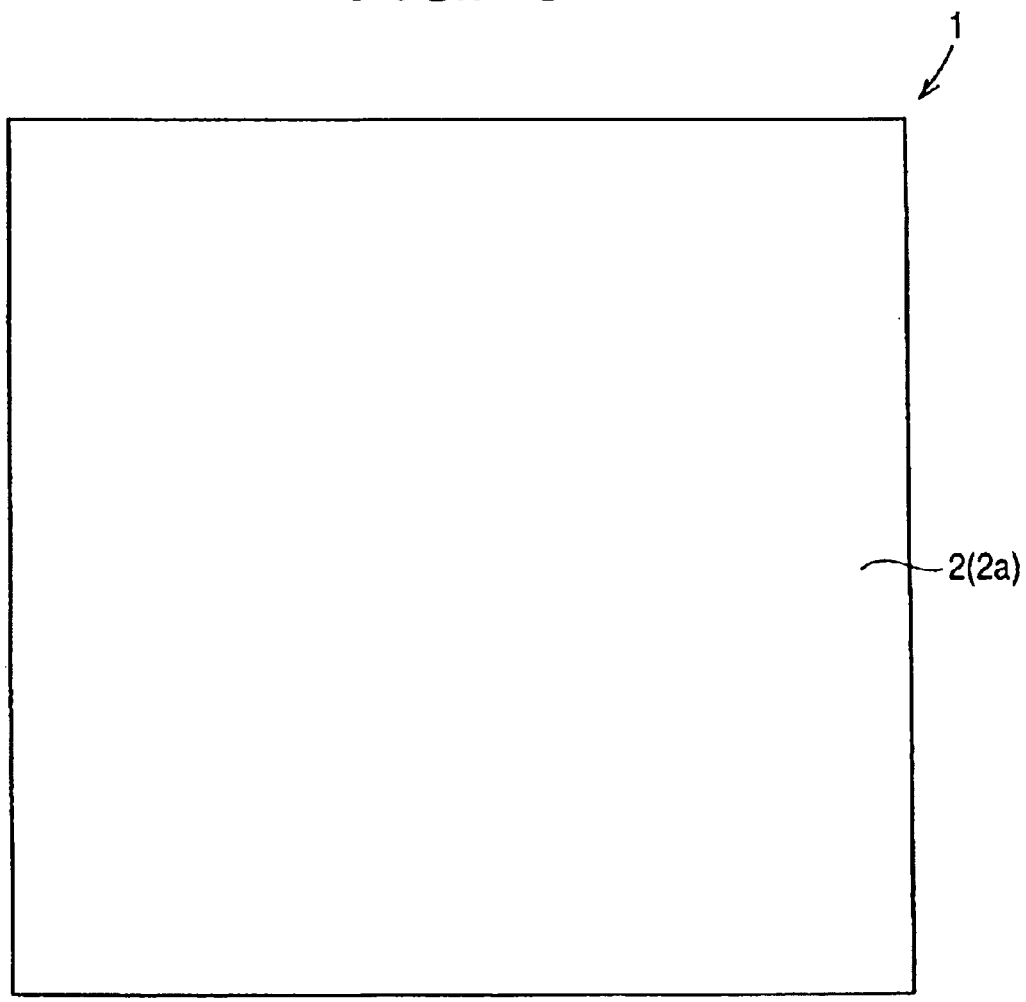
FIG. 3 is a back view of the semiconductor device of the first embodiment.
Figure 4:
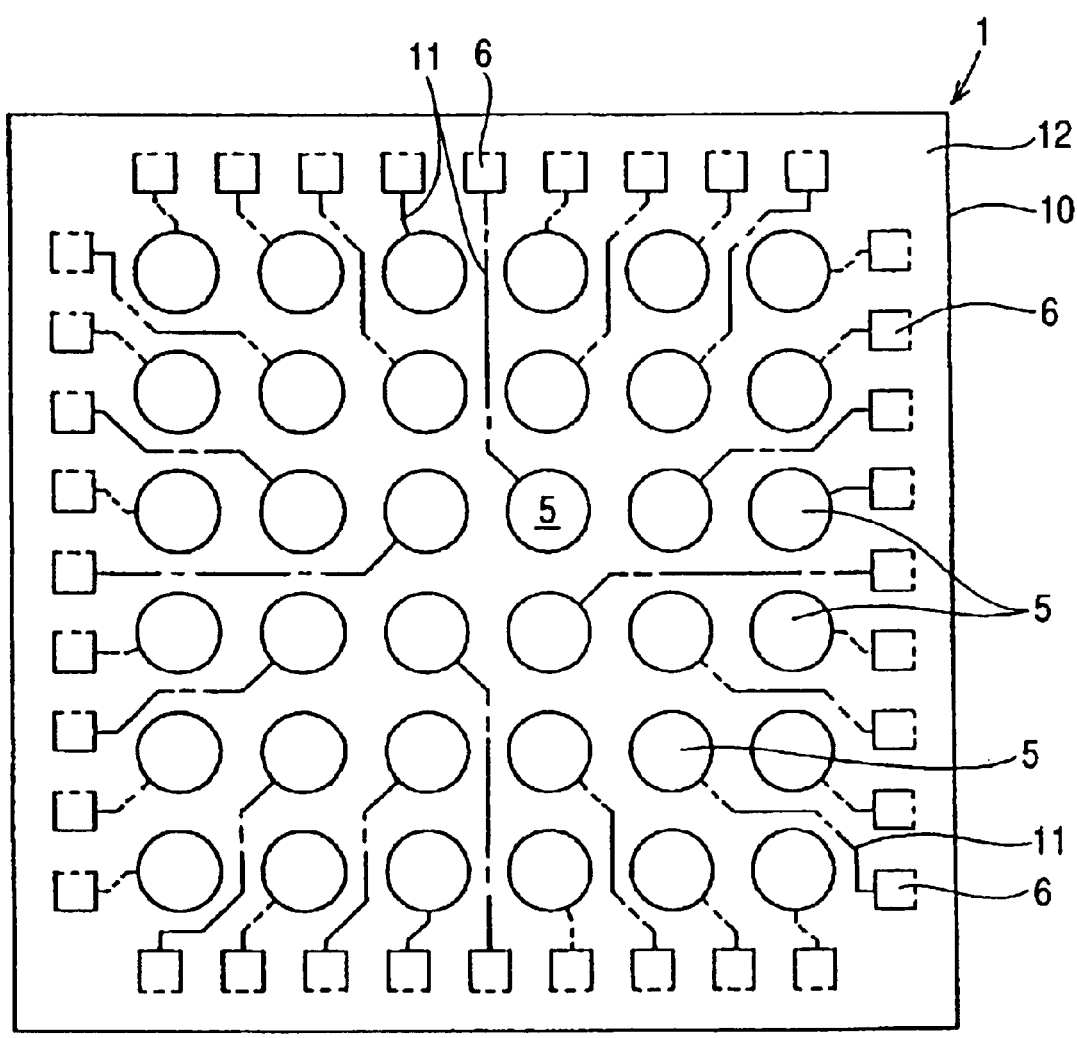
FIG. 4 is a schematic plan view of the semiconductor device of the first embodiment, showing a state of connection between area array bump electrodes and electrodes of a semiconductor chip.

FIGS. 1 to 14 are concerned with a semiconductor device according to one embodiment (first embodiment) of the present invention, of which FIG. 1 is a schematic sectional view of the semiconductor device, FIG. 2 is a plan view thereof, FIG. 3 is a back view thereof, and FIG. 4 is a schematic plan view of the semiconductor device, showing a state of connection between area array bump electrodes and electrodes of a semiconductor chip.

As shown in FIG. 1, the semiconductor device of this first embodiment, indicated at 1, is of a structure wherein a wiring substrate (wiring tape substrate) 3 is stacked and bonded onto a main surface (upper surface in FIG. 1) of a semiconductor chip 2 through an adhesive 4, and solder salient electrodes (area array bump electrodes) 5 are formed on an exposed surface (upper surface in FIG. 1) of the wiring tape substrate 3.

In FIG. 1, two area array bump electrodes 5 are shown in an enlarged and schematic manner also for making the structure of the wiring tape substrate 3 clear. More specifically, the area array bump electrodes 5 are arranged longitudinally and transversely in a lattice shape as shown in FIG. 2. The following description may partially refer to a case where the number of area array bump electrodes 5 is two such as a case associated with the manufacturing method.

Figure 5:
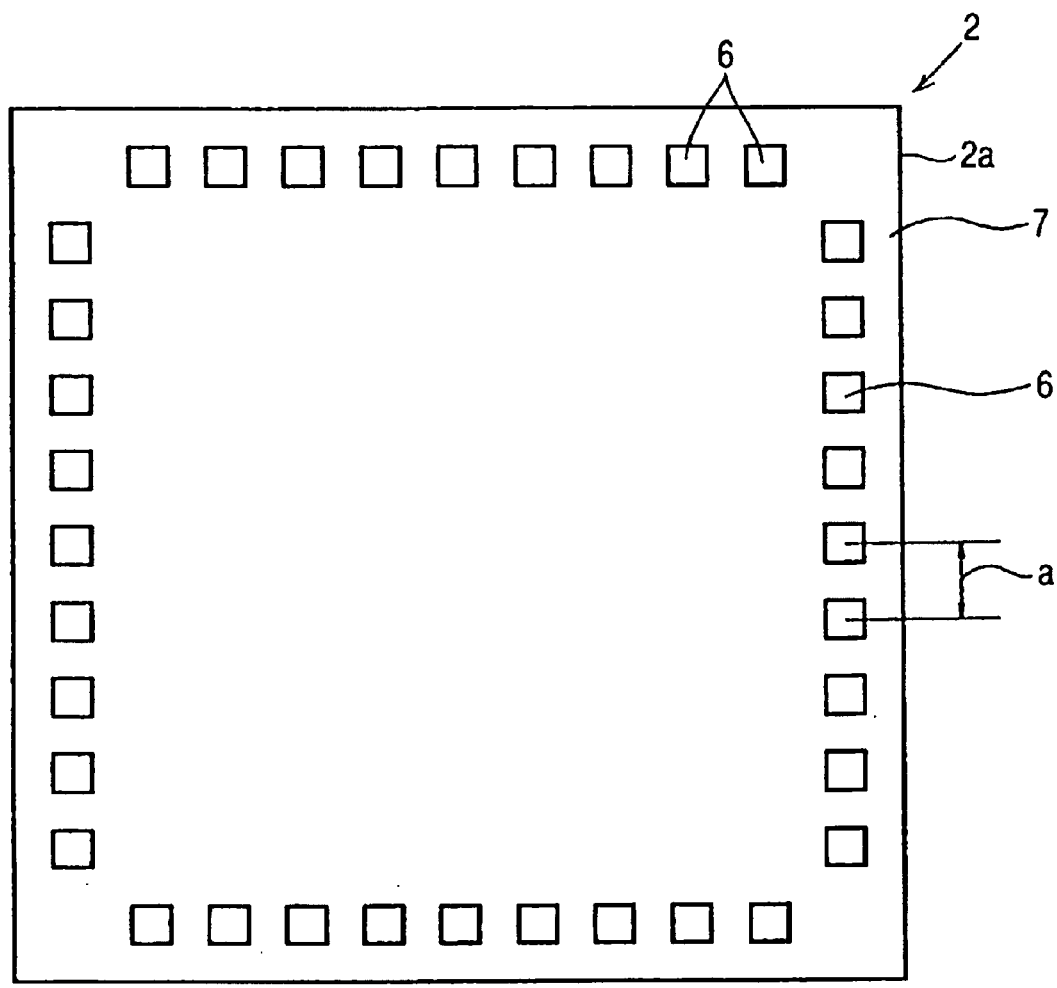
FIG. 5 is a schematic plan view of a semiconductor chip used in the semiconductor device of the first embodiment.

The semiconductor chip 2 is obtained by dicing longitudinally and transversely a semiconductor substrate (wafer) of a large diameter which has gone through a wafer process. As shown in FIGS. 3 and 5, the semiconductor chip 2 is formed mainly by a square semiconductor substrate (e.g. silicon substrate) 2a, as shown in FIGS. 3 and 5, with circuits such as LSI being formed thereon. On a main surface of the semiconductor substrate 2a, electrodes (bonding pads) 6 serving as circuit external terminals are arranged in a row along an area where input/output circuits (not shown) are formed (see FIG. 5).

In this first embodiment, the electrodes 6 are arranged, for example, along the peripheral edge of the semiconductor substrate 2a (semiconductor chip 2), and thus a so-called peripheral electrode array is formed. The main surface of the semiconductor substrate 2 exclusive of this electrode portion is covered with an insulating film (passivation film) 7 (see FIG. 1). The electrodes (bonding pads) 6 are terminals to which wires are connected, and are formed by a thin aluminum or aluminum alloy film. The electrodes 6 are square in shape having a size of about 60 to 90 $\mu$m, and a minimum pitch "a" thereof (see FIG. 5) is about 70 to 100 $\mu$m. As shown in FIG. 3, a back surface of the semiconductor chip 2 is a flat silicon face. This silicon face also serves as an outer wall face of the semiconductor device 1.

Figure 6:
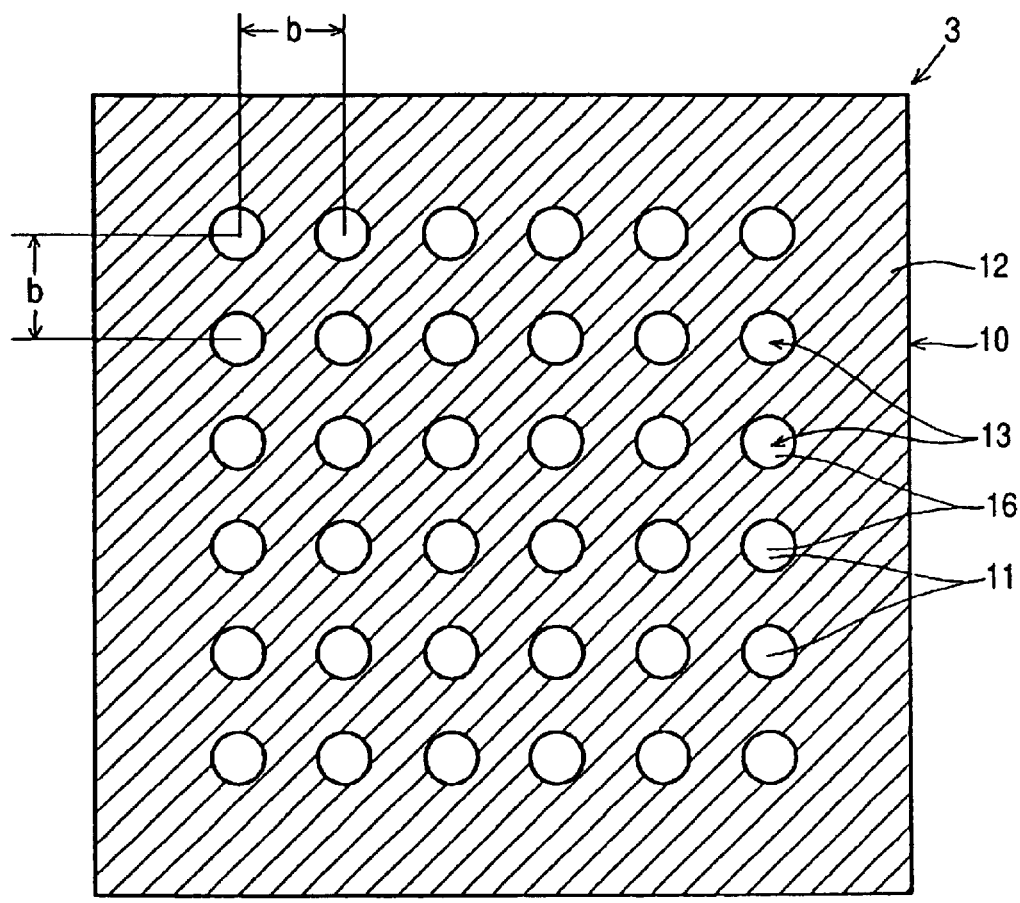
FIG. 6 is a plan view of a wiring tape substrate used in the semiconductor device of the first embodiment.
Figure 7:
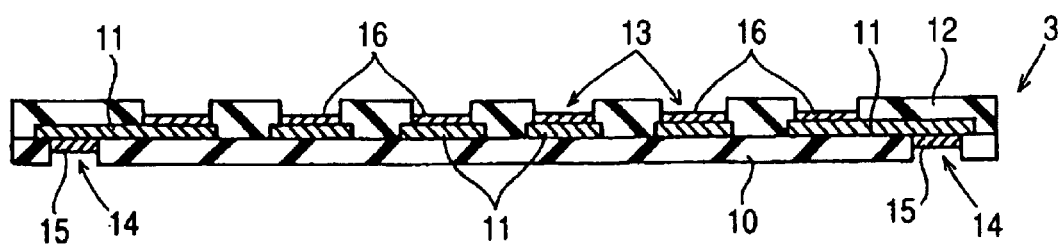
FIG. 7 is a schematic sectional view of the wiring tape substrate.
Figure 8:
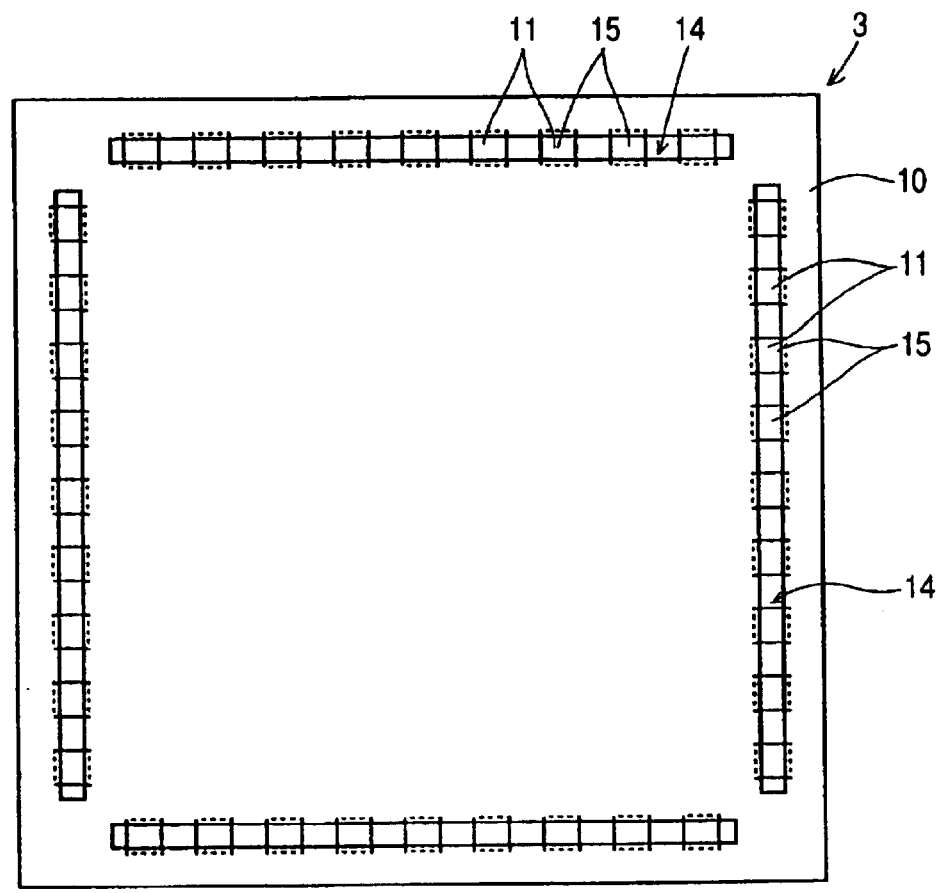
FIG. 8 is a back view of the wiring tape substrate.

The wiring tape substrate 3 has such a structure as shown in FIGS. 6 to 8, of which FIG. 6 is a plan view of the wiring tape substrate, FIG. 7 is a schematic sectional view thereof, and FIG. 8 is a back view thereof.

In this first embodiment, as shown in FIG. 7, the wiring tape substrate (wiring substrate) 3 is superimposed on the semiconductor chip 2 in registration with the chip and therefore has the same square shape of the same size as the semiconductor chip 2. The wiring tape substrate 3 comprises an insulating base layer (tape base) 10 formed of an organic resin material and having the same square shape as the semiconductor chip 2, wiring lines 11 formed on a surface of the tape base 10, and an insulating film (solder resist) 12 (the hatched area in FIG. 6) which not only covers the surface of the tape base 10 but also covers the wiring lines 11 selectively.

The areas where the solder resist 12 is not formed, i.e., apertures 13, are for example such circular areas as shown in FIG. 6, to which connections as portions of the wiring lines 11 are exposed. In the connections are formed solder salient electrodes (area array bump electrodes) 5 which will be described later. As shown in FIG. 6, the apertures 13 are formed longitudinally and transversely in a lattice shape. The pitch of the apertures, i.e., the pitch "b" of the area array bump electrodes, is larger than the pitch "a" of the electrodes 6 of the semiconductor chip 2 shown in FIG. 5. For example, the pitch "a" is about 80 to 100 $\mu$m and the pitch "b" is about 150 to 500 $\mu$m. By thus making the pitch of the electrodes 6 of the semiconductor chip 2 larger than the pitch of the area array bump electrodes 5, there can be attained a flip chip packaging superior in packaging performance.

As shown in FIG. 8, through holes (slots) 14 are formed in a back surface of the tape base 10 along the edges (sides) of the tape base. The slots 14 correspond to the electrodes 6 of the semiconductor chip 2 so that the electrodes 6 are positioned within the slots 14 respectively correspondingly when the wiring tape substrate 3 is superimposed on the semiconductor chip 2.

Outer end portions of the wiring lines 11 formed on the surface of the tape base 10 extent across the slots 14 and form exposed connections. When the wiring tape substrate 3 is superimposed on the semiconductor chip 2, the connections of the wiring lines 11 exposed to the slots 14 confront the electrodes 6 respectively of the semiconductor chip 2.

In FIG. 8, the outer end connections of the wiring lines 11 are shown in a rectangular shape schematically. Further, as shown schematically in FIG. 4, predetermined electrodes 6 and predetermined area array bump electrodes 5 are eventually connected electrically with each other through predetermined wiring lines 11. FIG. 4 is a schematic plan view of the semiconductor device, showing a state of connection between the electrodes 6 of the semiconductor chip 2 and the area array bump electrodes 5.

The positions of the apertures 13 are selected so that the area array bump electrodes 5 are formed at positions deviated from above the electrodes 6 of the semiconductor chip 2. This is because the area array bump electrodes are arranged on the main surface of the semiconductor chip 2 through the tape base 10 and the adhesive 4 after curing which are both lower in elastic modulus than gold wire bump electrodes, so when mounted on a packaging substrate 30, a thermal stress induced by a difference in thermal expansion coefficient between the semiconductor chip 2 and the packaging substrate 30 can be relaxed by both tape base 10 and adhesive 4. The electrodes 6 are connected to the connections of the wiring lines 11 through gold wire bump electrodes although this point will be described later.

As shown in FIG. 7, plating films 15 and 16 are formed on surfaces of the connections of the wiring lines 11 exposed to bottoms of the slots 14 and also on surfaces of the connections of the wiring lines 11 exposed to bottoms of the apertures 13.

The tape base 10 is formed by a flexible resin film using, for example, epoxy resin, aramid resin, or polyimide resin. The thickness of the tape base 10 is preferably about 30 to 100 $\mu$m from the standpoint of stress relaxation after mounting of the semiconductor device 1 onto the packaging substrate. The wiring lines 11 are formed by etching copper foil stuck on the tape base into predetermined patterns which copper foil is usually employed as a wiring material. The wiring portions of the wiring lines 11 exposed to the slots 14 and apertures 13 are used as electrodes, but for decreasing the contact resistance of metal and for promoting the reactivity of solder it is preferable that those electrode portions be coated with, for example, nickel or gold, and such plating films 15 and 16 as referred to above are formed thereon. For example, the plating films 15 and 16 are Sn plating films or Ni—Au plating films.

The thickness of the tape base 10 is larger than the thickness of the solder resist 12 so as not to cause warping even upon cure shrinkage of the solder resist. For example, when the thickness of the tape base 10 is about 20 to 100 $\mu$m, that of the solder resist 12 is about 20 to 50 $\mu$m.

Gold wire bump electrodes 20 are fixed onto the electrodes 6 of the semiconductor chip 2 and their tips are connected to the plating films 15 of the connections of the wiring lines 11. Further, area array bump electrodes 5 are fixed respectively to the apertures 13 of the wiring tape substrate 3.

Figure 9:
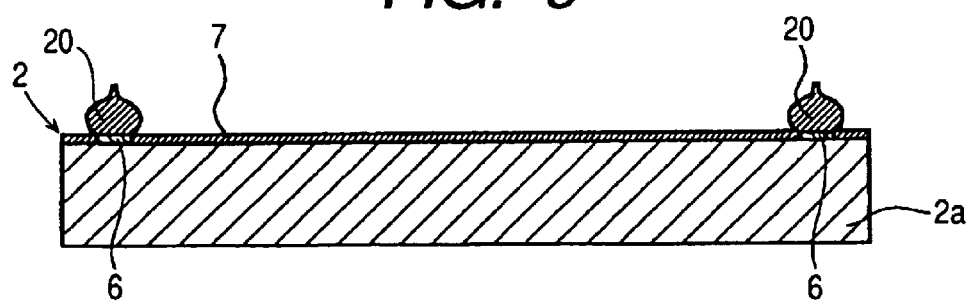
FIG. 9 is a schematic sectional view showing a semiconductor chip with gold wire bump electrodes formed on electrodes of the chip in the manufacture of the semiconductor device of the first embodiment.

Next, with reference to FIGS. 9 to 13, a description will now be given about the manufacture of the semiconductor device 1 of this first embodiment. As shown in FIG. 9, gold wire bump electrodes 20 are formed on the electrodes 6 of the semiconductor chip 1. Though not specially shown, tips of gold wires (for example, 20 to 30 $\mu$m in diameter) held by a bonding tool in a conventional wire bonding apparatus are melted with a discharge torch or the like to form balls (for example, 50 to 80 $\mu$m in diameter), which are then crushed and fixed onto the electrodes 6 of the semiconductor chip 2 with the bonding tool. Thereafter, the wires are pulled to cut them at the bonded portions to form such gold wire bump electrodes (gold stud bumps) 20 as shown in FIG. 9. Since the cutting of the wires is done by pulling the wires, the tip diameter of each gold wire bump electrode 20 becomes smaller than the diameter of each gold wire. The diameter of the ball-like portion fixed to each electrode 6 becomes 60 to 90 $\mu$m or so and the height thereof becomes 70 $\mu$m or so. In this first embodiment, as will be described later, pointed portions (convex portions) are utilized for connection to the connections of the wiring lines 11.

Figure 10:
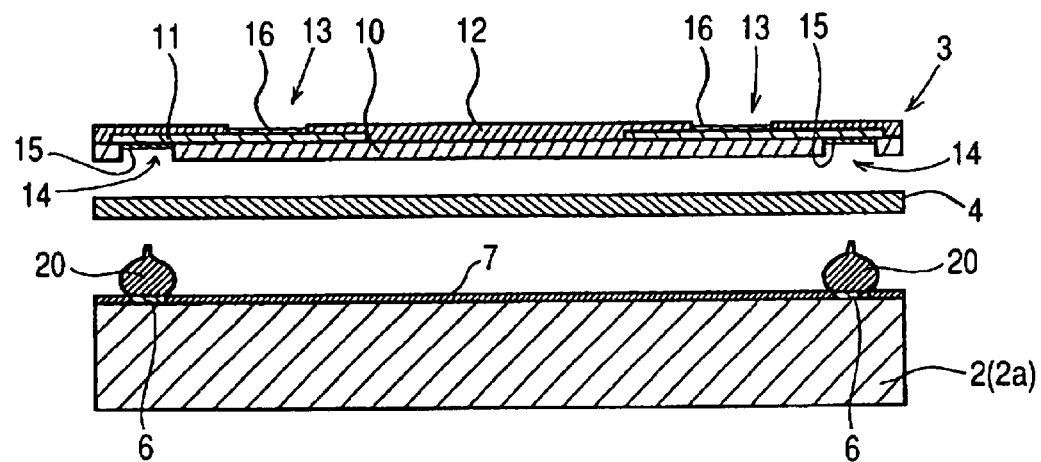
FIG. 10 is a schematic sectional view showing an adhesive and a wiring tape substrate both stacked on the semiconductor chip in manufacturing the semiconductor device of the first embodiment.

Then, as shown in FIG. 10, a semi-solid adhesive 4 and a wiring tape substrate 3 both of approximately the same size as the semiconductor chip 2 are superimposed on the surface of the semiconductor chip 2 with the gold wire bump electrodes 20 formed thereon. In FIG. 10, the semiconductor chip 2, the adhesive 4, and the wiring tape substrate 3, which are mutually superimposed, are shown separately so as to make it easier to see.

Figure 11:
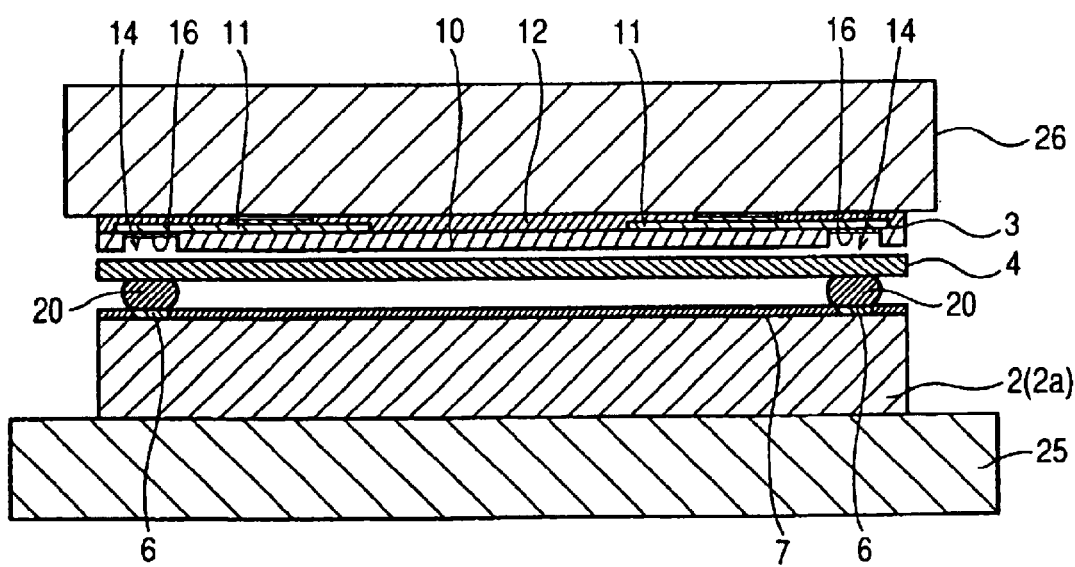
FIG. 11 is a schematic sectional view showing in what state the wiring tape substrate is bonded onto the semiconductor chip through an adhesive in manufacturing the semiconductor device of the first embodiment.
Figure 12:
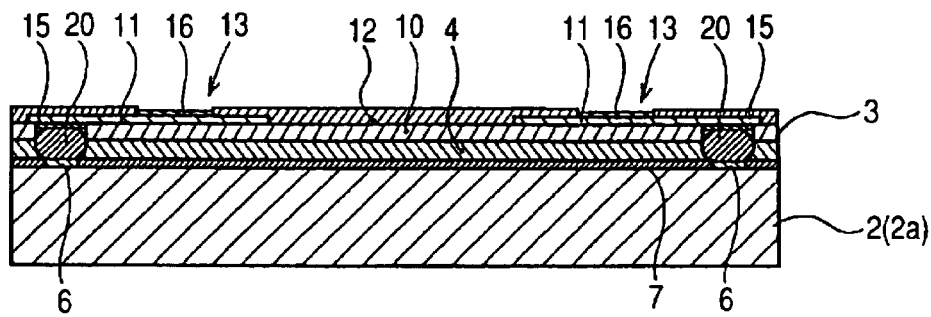
FIG. 12 is a schematic sectional view showing the wiring tape substrate bonded on the semiconductor chip through the adhesive in manufacturing the semiconductor device of the first embodiment.

Next, as shown in FIG. 11, the semiconductor chip 2, the adhesive 4, and the wiring tape substrate 3 are positioned and sandwiched in between a lower mold 25 and an upper mold 26 of a heating/pressing apparatus and are heated and pressed at predetermined temperature and pressure to electrically connect the gold wire bump electrodes 20 and the connections of wiring lines 11 exposed to the bottoms of slots 14 formed in the wiring tape substrate 3 with each other. At the same time, the adhesive 4 is heat-cured to fix the wiring tape substrate 3 to the semiconductor chip 2 (see FIG. 12).

As the adhesive 4 there is used an insulating, thermosetting resin for example. In this bonding work, the convex portions at the tips of the gold wire bump electrodes 20 formed respectively on the electrodes 6 of the semiconductor chip 2 are allowed to pierce through the adhesive 4, thereby connecting the gold wire bump electrodes 20 electrically with the connections of the wiring lines 11 on the wiring tape substrate 3. Sn or Ni—Au plating film is formed on the surfaces of the connections of the wiring lines 11 exposed to the bottoms of slots 14 formed in the wiring tape substrate 3. Thus the bonding between the gold wire bump electrodes 20 and the connections is Au—Sn bonding (Au—Sn alloy) or Au—Au bonding.

As the adhesive 4 there also may be used a commercially available NCF (Non Conductive Film) or ACF (Anisotropic Conductive Film). In case of using ACF, the gold wire bump electrodes 20 and the connections of the wiring lines 11 exposed to the bottoms of the slots 14 formed in the wiring tape substrate 3 are electrically connected with each other through conductive particles contained in ACF.

Figure 13:
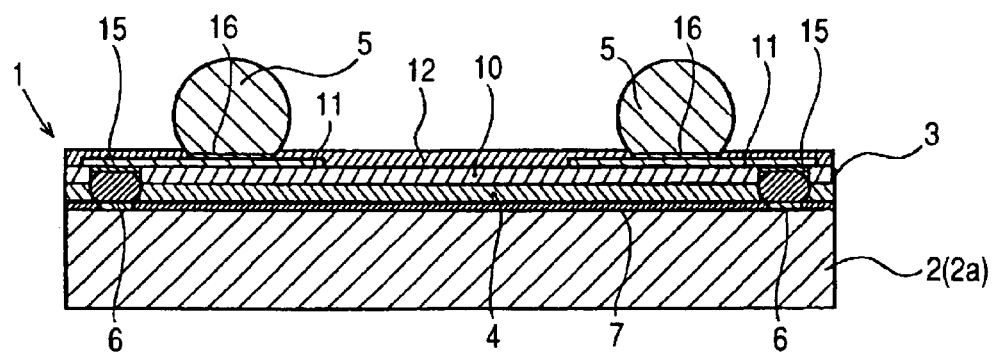
FIG. 13 is a sectional view showing a fixed state of area array bump electrodes to the wiring tape substrate in manufacturing the semiconductor device of the first embodiment.

Next, as shown in FIG. 13, area array bump electrodes 5 are fixed onto the connections of the wiring lines 11 exposed to the bottoms of apertures 13 formed in the wiring tape base 3. A plating film 16, which is Sn or NI—Au plating film, is formed on the surface of each of the aforesaid connections. For forming the area array bump electrodes 5, solder balls formed by Pb—Sn eutectic solder or Pb free solder are fed to the apertures 13 and area array bump electrodes 5 are formed by heat reflow. For example, area array bump electrodes 5 having a diameter of 450 $\mu$m and a height of 400 $\mu$m are formed by the supply of 400 $\mu$m dia. solder balls to the apertures 13.

From the standpoint of relaxing a thermal stress induced between a packaging substrate and the semiconductor chip it is preferable that an organic resin layer of a low elastic modulus be formed to a thickness of 50 to 100 $\mu$m or more. However, if a layer of the adhesive 4 is to be formed to a thickness of 50 $\mu$m or more with use of a thermosetting resin such as NCF, there arises the problem that the flatness of the solder bump electrodes 5 is deteriorated due to partial variations in thickness which occur in the heat-curing step.

In a semiconductor device manufactured by adopting such a method as in this embodiment wherein not only heat but also pressure is applied at the time of packaging the semiconductor chip, the above problem of flatness deterioration arises more markedly.

According to a countermeasure effective for solving such a problem, a tape base 10 is disposed between the solder salient electrodes 5 and the semiconductor chip 2 while keeping the layer thickness of the adhesive 4 to a value of not larger than 50 $\mu$m to increase the thickness of the organic resin layer formed between the solder bump electrodes 5 and the semiconductor chip 2.

The tape base 10 may be disposed between the solder salient electrodes 5 and the semiconductor chip 2 in the following manner. A wiring tape substrate 3 having wiring lines on both surfaces of the tape base 10 is provided, then solder salient electrodes 5 are formed on the surface-side wiring lines, and the back-surface wiring lines and the salient bump electrodes 20 of the semiconductor chip 2 are connected with each other. However, the wiring tape substrate 3 having wiring lines on both sides of the tape base 10 is very expensive in comparison with a wiring tape substrate 3 having wiring lines on only one side of the tape base 10.

In case of using the less expensive wiring tape substrate 3 having wiring lines on only one side of the tape base 10 as in this embodiment, a back surface of the tape base 10 opposite to a main surface thereof on which wiring lines are formed is made face to face with the semiconductor chip, and the gold salient electrodes 20 and the wiring lines are connected together in the interiors of slots (through holes) 14 formed in the tape base, whereby the tape base 10 can be disposed between the solder bump electrodes 5 and the semiconductor chip 2.

Although in this first embodiment a single semiconductor chip 2 is mounted on the wiring tape substrate 3, an MCM (multi-chip module) structure may also be constituted by changing wiring patterns of the wiring tape substrate so as to mount a larger number of semiconductor chips 2.

Figure 14:
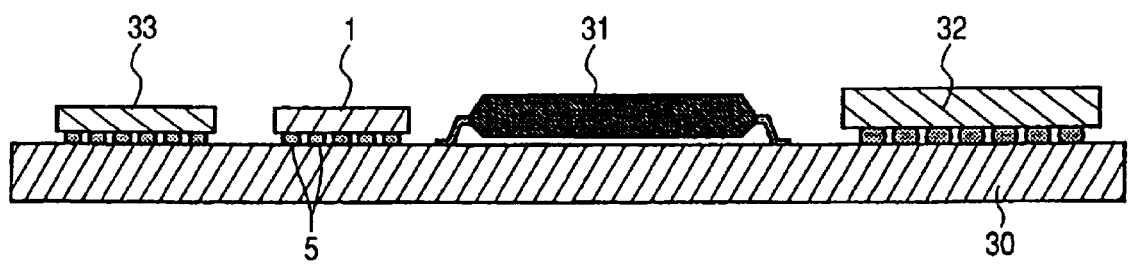
FIG. 14 is a schematic sectional view showing a part of an electronic device on which the semiconductor device of the first embodiment is mounted.

The semiconductor device constructed as above is mounted on a packaging substrate in a predetermined electronic device as shown in FIG. 14, which is a schematic diagram showing a part of the electronic device. On a packaging substrate 30 are mounted the semiconductor device 1 of this first embodiment and semiconductor devices of other package structures, i.e., QFP (Quad Flat Package) 31, BGA (Ball Grid Array) 32, and CSP (Chip Size Package) 33. Of course, on the packaging substrate 30 are also mounted other electronic parts such as resistors, capacitors, and connectors, though not shown.

The following effects are obtained according to this first embodiment.

(1) The semiconductor chip 2 with wire bonding electrodes 6 arranged along the peripheral edges of the chip, available as a bare chip, can be made into area array bump electrodes 5 of a larger pitch than the electrodes 6 by using the wiring tape substrate 3, so that it is possible to improve electric characteristics. For example, the inductance which is essential to high-speed signal processing can be decreased from 1 to 1.5 nH to about 0.1 nH in comparison with CSP using the wire bonding method. This is because wire bonding is not used in the present invention and therefore the inductance of 1 to 1.5 nH, which depends on the wire length in wire bonding, is not included at all.

(2) By making the wire bonding electrodes 6 into the area array bump electrodes 5 larger in size and wider in pitch than the electrodes 6 it is possible to enhance the connection reliability at the time of packaging the semiconductor device 1.

(3) Since the wiring tape substrate 3 with the area array bump electrodes 5 formed thereon is of the same size as the semiconductor chip 2 and is constructed so as to be superimposed on the semiconductor chip in registration with the chip, it is possible to reduce the size of the semiconductor device 1.

(4) The area array bump electrodes 5 are arranged in areas deviated from the areas where the gold wire bump electrodes 20 are arranged. Further, the elastic modulus of the gold wire bump electrodes 20 is higher than the elastic moduli of the tape base 10 and the adhesive 4. Thus, the area array bump electrodes 5 are arranged on the main surface of the semiconductor chip 2 through the tape base 10 and the adhesive 4 after curing both lower in elastic modulus than the gold wire bump electrodes 20, whereby when the semiconductor chip 2 is mounted on the packaging substrate 30, a thermal stress induced by a difference in thermal expansion coefficient between the semiconductor chip and the packaging substrate can be relaxed by both tape base 10 and adhesive 4.

(5) Between the semiconductor chip 2 and the area array bump electrodes 5 disposed on the main surface of the chip there is formed an organic resin layer of a low elastic modulus at a thickness of 50 to 100 μm or more, whereby a thermal stress induced between the packaging substrate 30 and the semiconductor chip 2 is relaxed.

(6) If the layer thickness of the adhesive 4 formed by a thermosetting resin such as ACF or NCF is to be set at 50 μm or more, there arises the problem that the flatness of the area array bump electrodes 5 formed thereon is deteriorated due to partial variations in thickness which occur in the heat-curing step. According to the present invention, however, the tape base 10 is disposed between the area array bump electrodes 5 and the semiconductor chip 2 while keeping the layer thickness of the adhesive 4 to below 50 μm, whereby it is possible to ensure a sufficient thickness of the organic resin layer between the area array bump electrodes 5 and the semiconductor chip 2 and consequently it is possible to prevent a lowering in flatness of the area array bump electrodes 5.

(7) Since the insulating base layer is formed by a flexible resin film, i.e., the tape base 10, and its thickness is about 30 to 100 μm, the stress after mounting the semiconductor device 1 onto the packaging substrate 30 is relaxed and hence the packaging reliability is improved.

(8) The reduction in size and weight and speed-up of the semiconductor device 1 are important factors in the field of communication devices and the field of portable devices. A higher function can be achieved by packaging the semiconductor chip 2 in accordance with a flip chip packaging method and by adopting an MCM structure. A high-density MCM can be attained by mounting DRAM (Dynamic Random Access Memory), SRAM (Static Random Access Memory), flash memory, logic IC, and high-frequency IC onto a single substrate.

(Second Embodiment)

Figure 15:
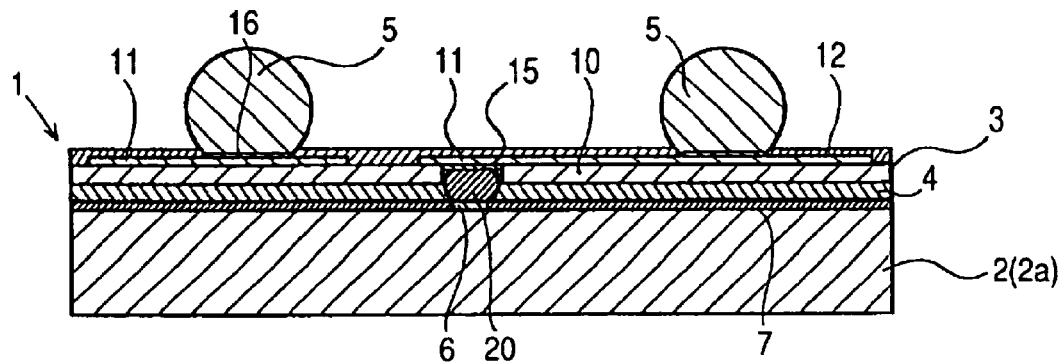
FIG. 15 is a schematic sectional view showing a semiconductor device according to another embodiment (second embodiment) of the present invention.

FIG. 15 is a schematic sectional view showing a semiconductor device according to another embodiment (second embodiment) of the present invention. In the previous first embodiment the electrodes 6 formed on the main surface of the semiconductor chip 2 are arranged in a peripheral array in which they are arranged along the edges of the semiconductor chip 2. But according to the construction of this second embodiment, electrodes 6 are arranged near the center of a semiconductor chip 2 and along an area where a semiconductor element for I/O circuit is disposed (central electrode array), and a wiring tape substrate 3 is superimposed and stuck through an adhesive 4 onto the semiconductor chip 2 with the electrodes 6 thus arranged thereon, further, area array bump electrodes 5 are mounted to predetermined positions of the wiring tape substrate 3. Also in this construction there can be obtained the same effects as in the first embodiment.

Although in this second embodiment the electrodes 6 are arranged in one row along the center of the semiconductor chip 1, there also may be adopted a combination thereof with a semiconductor chip 2 wherein electrodes 6 are arranged in two or more plural rows.

(Third Embodiment)

Figure 16:
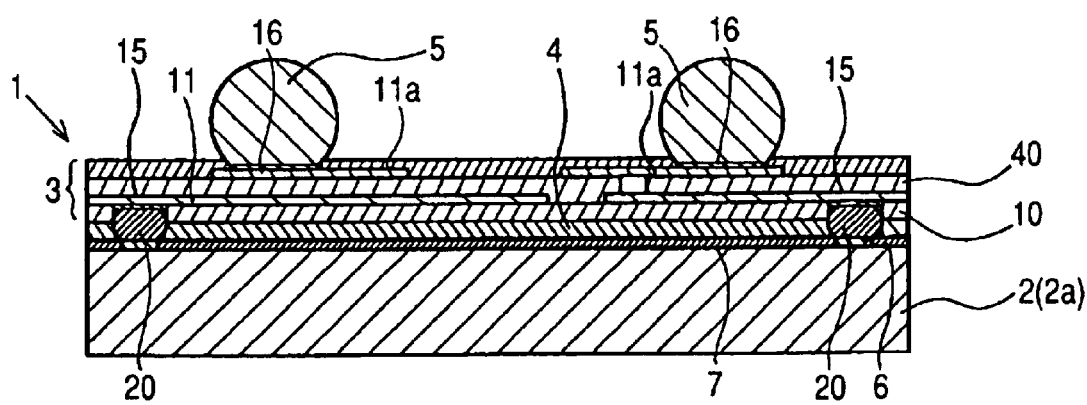
FIG. 16 is a schematic sectional view showing a semiconductor device according to a further embodiment (third embodiment) of the present invention.

FIG. 16 is a schematic sectional view showing a semiconductor device according to a further embodiment (third embodiment) of the present invention. In this third embodiment, wiring lines in a wiring tape substrate 3 are formed in multiple layers to increase the degree of margin for wiring distribution.

More specifically, in the semiconductor device 1 of the first embodiment, one interlayer insulating film 40 of a predetermined pattern is formed on the wiring lines 11 formed on the surface of the tape base 10, then wiring lines 11*a* are formed on the interlayer insulating film 40 and are covered with the solder resist 12 which is formed selectively, further, there are formed area array bump electrodes 5 connected electrically to the wiring lines 11*a*.

The wiring lines 11 connected electrically to the gold wire bump electrodes 20 formed on the electrodes 6 of the semiconductor chip 2 and the area array bump electrodes 5 formed on the surface of the tape base 10 are conducted with each other through wiring lines 11*a* and 11 located respectively above and below the interlayer insulating film 40.

In this third embodiment there may be adopted a construction wherein the number of the interlayer insulating film is increased to obtain a larger number of wiring layers. In this case, wiring lines are formed on each of the interlayer insulating films and the wiring lines on the top layer of interlayer insulating film are covered with the solder resist which is formed selectively, further, the bottom layer of wiring lines connected electrically to the gold wire bump electrodes which are formed on the electrodes of the semiconductor chip and the area array bump electrodes formed on the surface of the tape substrate are conducted with each other through upper and lower wiring lines of the interlayer insulating film.

If there is adopted a structure wherein at least wiring lines for power supply and for the ground are provided on the wiring tape substrate on the side where the semiconductor chip is fixed, it is possible to stabilize the potential and improve electric characteristics. Further, also in this third embodiment, an MCM structure can be obtained by fixing plural semiconductor chips to the wiring tape substrate.

In this third embodiment, by providing plural wiring layers, the area array bump electrodes 5 can be arranged in a still higher density and hence it becomes possible to attain a multi-pin structure of a semiconductor device.

For attaining a multi-layer wiring structure there also may be adopted a structure wherein wiring lines are formed on both surface and back respectively of a single tape base. In this structure, the wiring lines formed on both such surface and back are conducted with each other through through-holes formed in the tape base. The wiring lines on the surface of the tape base are covered selectively with solder resist provided on the wiring tape substrate. The portions not covered with the solder resist serve as apertures for the formation of area array bump electrodes.

Also in this example, as is the case with the previous example, if there is adopted a structure wherein at least wiring lines for power supply and for the ground are provided on the wiring tape substrate on the side where the semiconductor chip is fixed, it is possible to stabilize the potential and improve electric characteristics. Further, by fixing plural semiconductor chips to the wiring tape substrate, it is possible to also attain an MCM structure.

(Fourth Embodiment)

Figure 17:
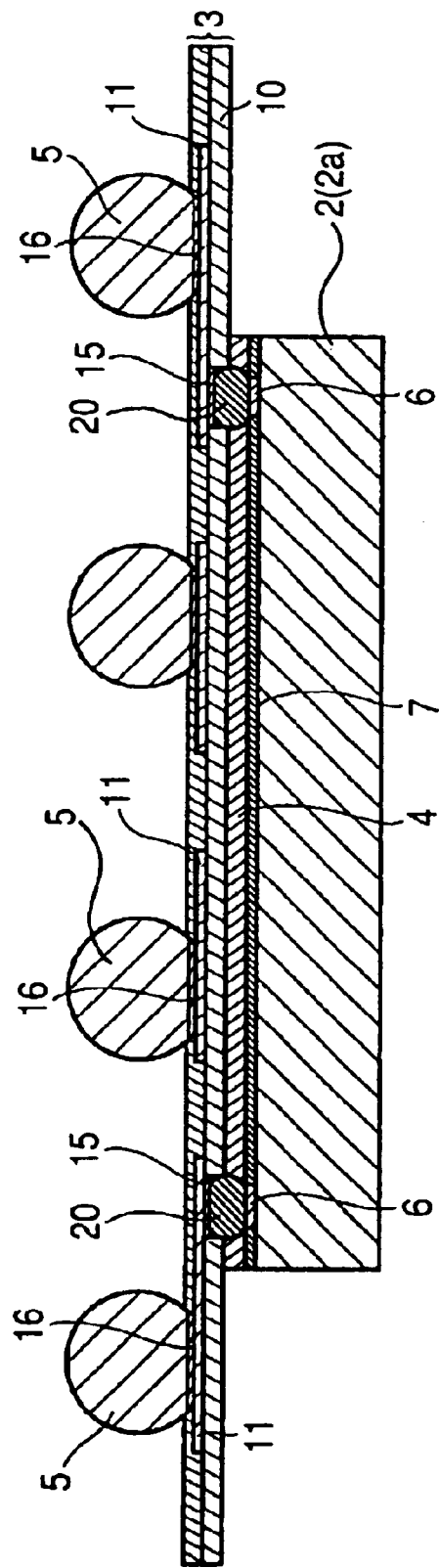
FIG. 17 is a schematic sectional view showing a semiconductor device according to a still further embodiment (fourth embodiment) of the present invention.

FIG. 17 is a schematic sectional view showing a semiconductor device according to a still further embodiment (fourth embodiment) of the present invention. According to this fourth embodiment, the pitch of area array bump electrodes 5 can be made wider.

More specifically, in this fourth embodiment, the wiring tape substrate 3 in the semiconductor device of the first embodiment is made larger (larger in area) than the semiconductor chip 2, as shown in FIG. 17. According to the structure of this fourth embodiment, the outer periphery of the wiring tape substrate 3 is projected from all the peripheral edges of the semiconductor chip 2.

In this embodiment, since the wiring tape substrate 3 can be made wide, the pitch of the area array bump electrodes 5 can be made larger than that in the first embodiment and hence it is possible to set large the pitch of electrodes on the packaging substrate for packaging the semiconductor device of this embodiment.

(Fifth Embodiment)

Figure 18:
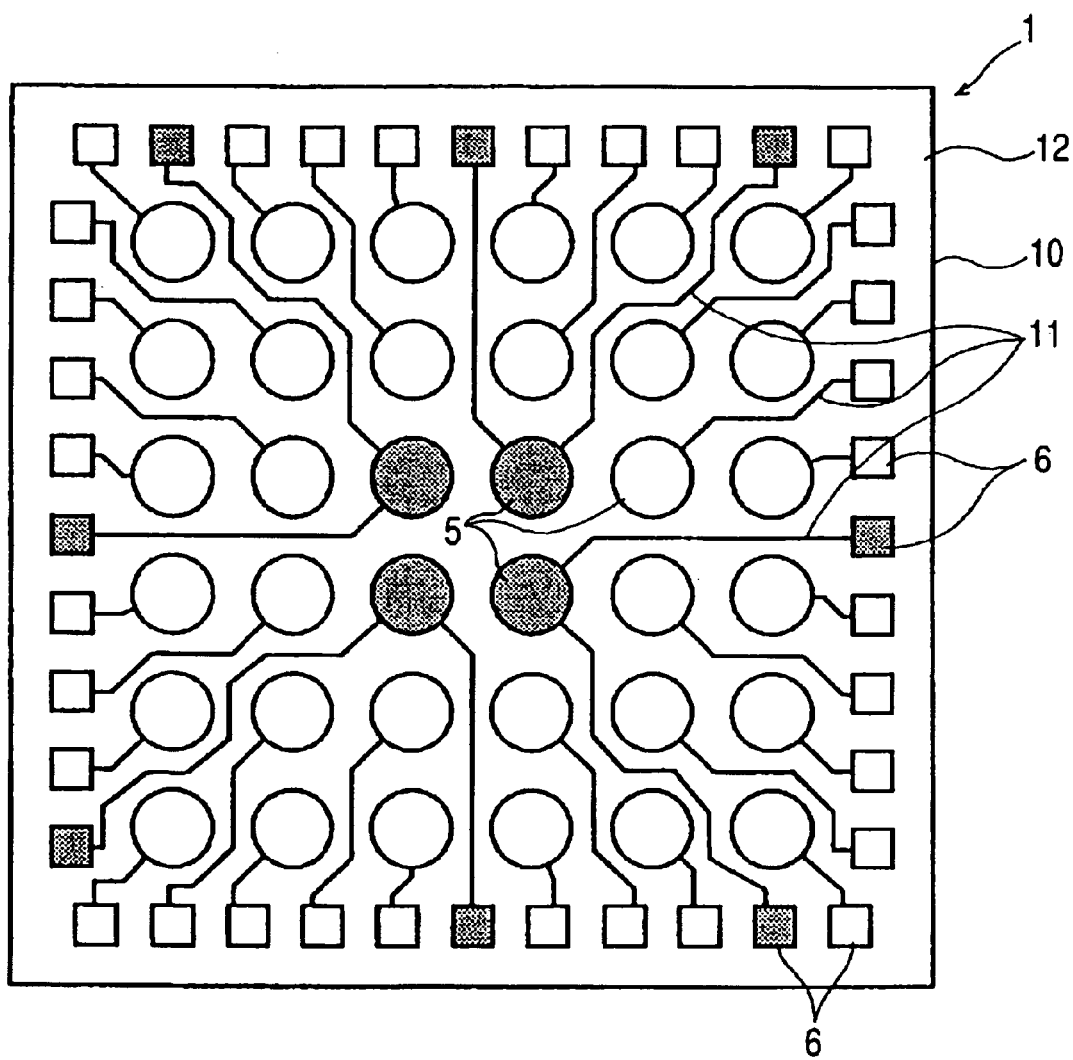
FIG. 18 is a schematic plan view of a semiconductor device according to a still further embodiment (fifth embodiment) of the present invention, showing a state of connection between area array bump electrodes and electrodes of a semiconductor chip.

FIG. 18 is a schematic plan view of a semiconductor device according to a still further embodiment (fifth embodiment) of the present invention, showing a state of connection between area array bump electrodes and electrodes formed on a semiconductor chip. In the semiconductor device of this fifth embodiment, indicated at 1, out of plural solder salient electrodes (area array bump electrodes) 5 formed on a main surface of a wiring substrate (wiring tape substrate) 3, at least one solder salient electrode 5 is connected to plural electrodes 6 out of plural electrodes 6 formed on a main surface of a semiconductor element (semiconductor chip) 2, thus serving as a common electrode.

As shown in FIG. 18, four solder salient electrodes 5 arranged centrally and dotted for clarity serve as common electrodes. Since some of the solder salient electrodes 5 thus serve as common electrodes, the number of the electrodes 5 can be made smaller than that of the electrodes 6 of the semiconductor chip 6. The electrodes 6 which are connected through wiring lines 11 to the solder salient electrodes 5 serving as common electrodes are also dotted.

In the semiconductor device of the first embodiment, etc., since wiring lines are formed on only one side of the wiring substrate (wiring tape substrate) 3, the wiring freedom is smaller than that in the conventional structure having multi-layer interconnection on a resin substrate. In this fifth embodiment, in view of this point, there are formed bump lands connected to plural electrodes 6 on the semiconductor chip 2 and the number of such bump lands is set smaller in comparison with the on-chip electrodes 6, thereby ensuring a larger space which is effective for the distribution of wiring on the wiring tape substrate and permitting connection with a semiconductor chip having a larger number of pins, even in a single-layer wiring structure. The common electrodes (common wiring lines) are used for the supply of ground (GND) potential and source potential.

Figure 19:
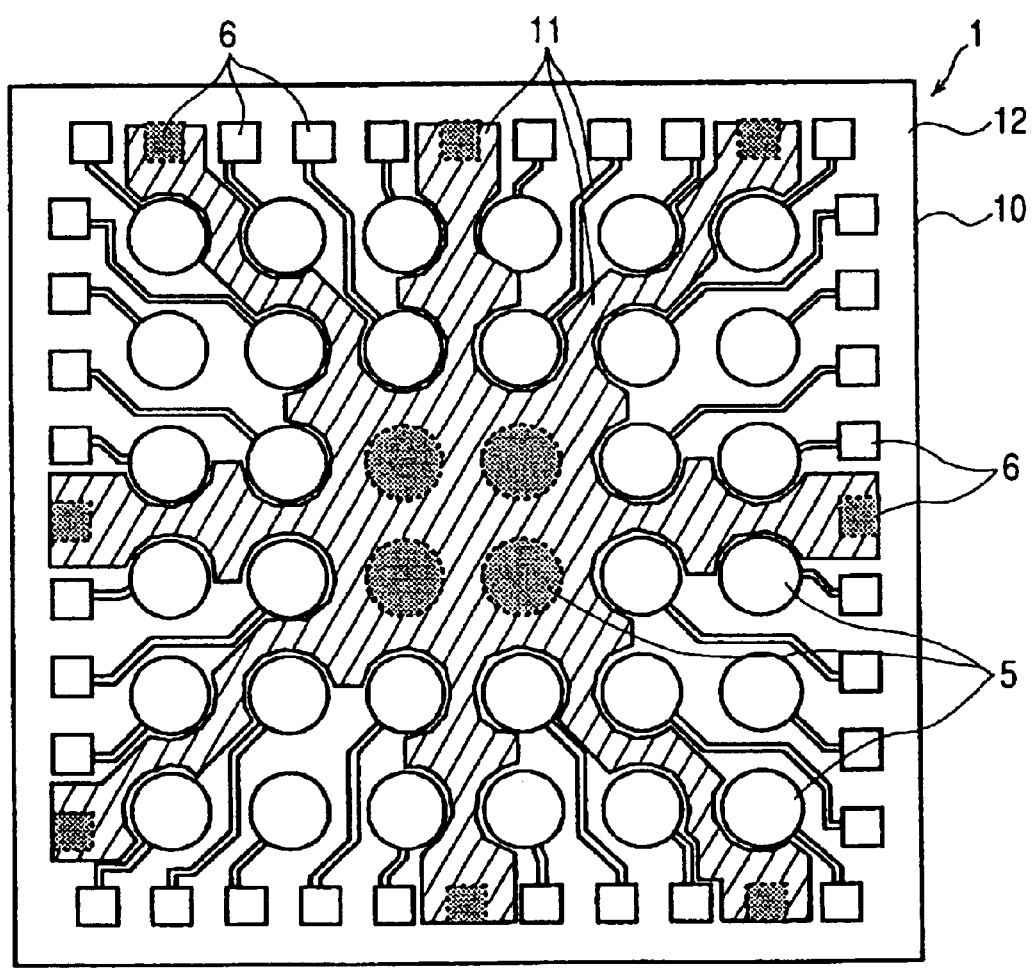
FIG. 19 is a schematic plan view of a semiconductor device according to a modification of the fifth embodiment, showing a state of connection between area array bump electrodes and electrodes of a semiconductor chip.

FIG. 19 is a schematic plan view of a semiconductor device according to a modification of the fifth embodiment, showing a state of connection between area array bump electrodes and electrodes of semiconductor chips. It is effective for the common wiring lines to be used for the supply of GND potential and source potential. In this case, as shown in FIG. 19, in the electrodes 6 connected to the common solder salient electrodes 5 through wiring lines 11, if the widths of the wiring lines 11 are widened as shown with hatching to adjust the spacing between them and signal I/O wiring lines, it is possible to change wiring characteristics such as wiring impedance.

(Sixth Embodiment)

Figure 20:
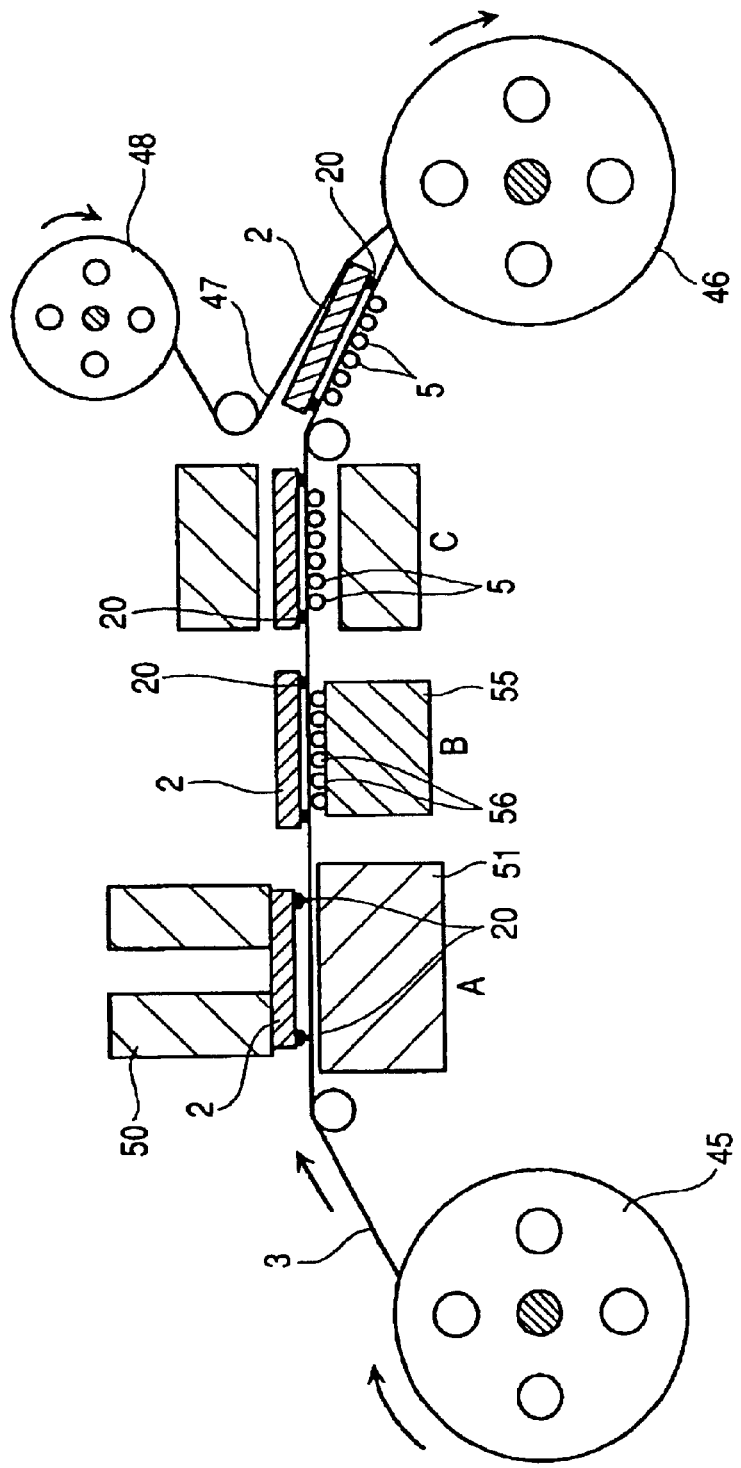
FIG. 20 is a schematic diagram showing a method of fabricating a semiconductor device using a multi-substrate tape according to a still further embodiment (sixth embodiment) of the present invention.
Figure 21:
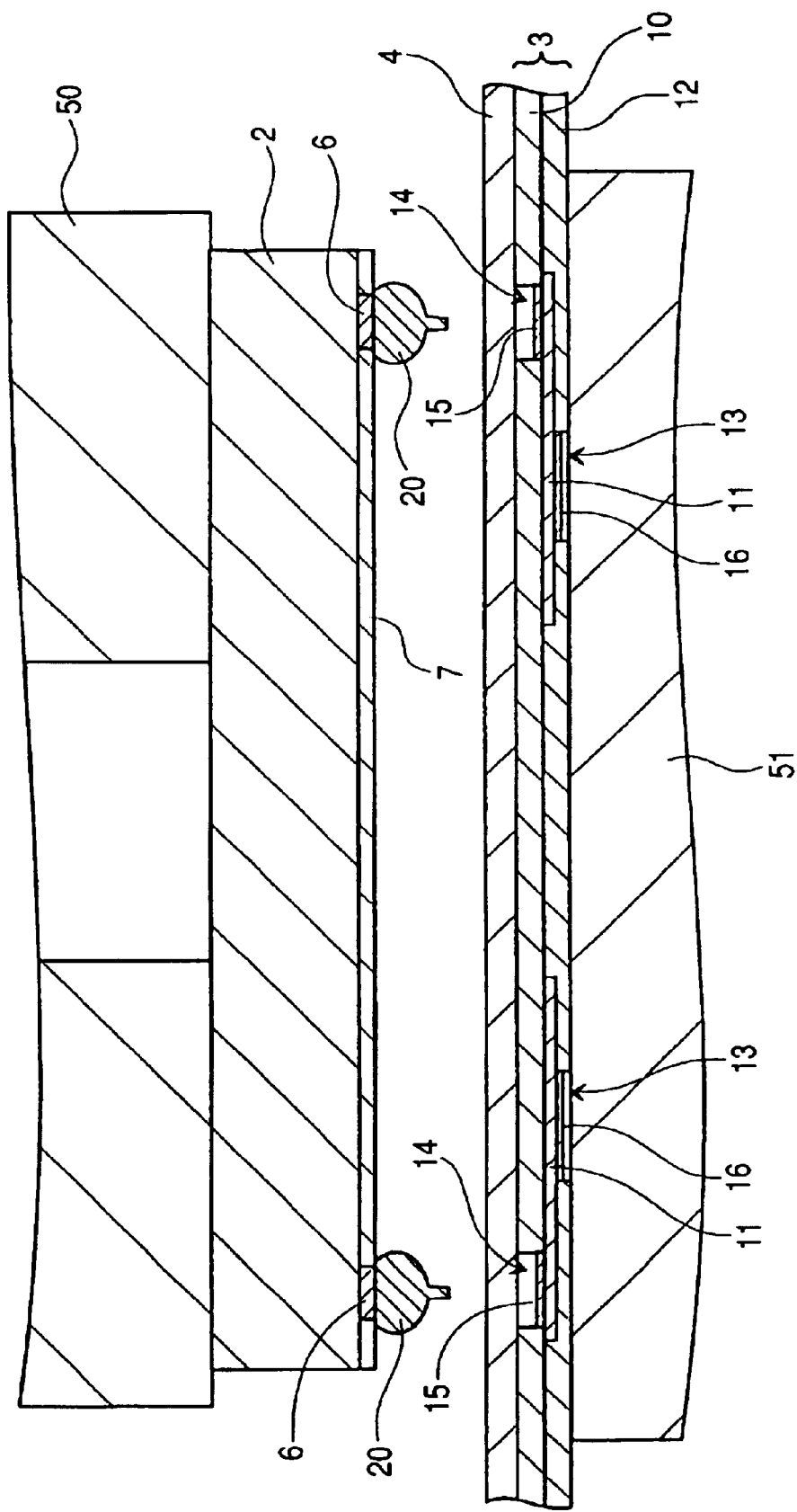
FIG. 21 is an enlarged schematic diagram showing a state in which a semiconductor chip is mounted onto a wiring tape substrate in manufacturing the semiconductor device of the sixth embodiment.
Figure 22:
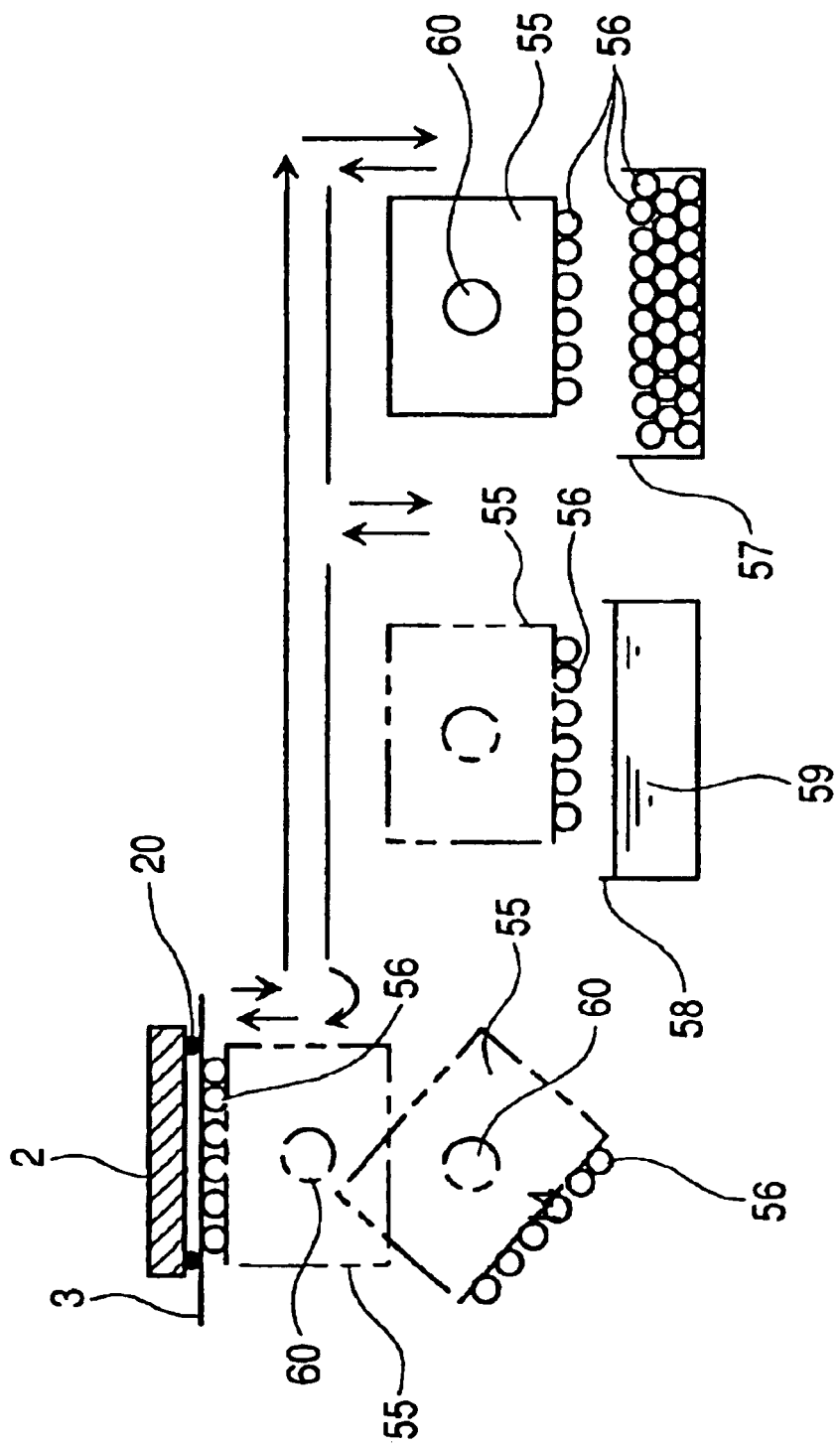
FIG. 22 is a schematic diagram showing in what manner solder salient electrodes are formed by the supply of solder balls in manufacturing the semiconductor device of the sixth embodiment.

FIGS. 20 to 22 are concerned with a method of manufacturing a semiconductor device according to a still further embodiment (sixth embodiment) of the present invention, of which FIG. 20 is a schematic diagram showing a semiconductor device manufacturing method using a band-like wiring tape substrate (multi-substrate tape).

The semiconductor device manufacturing method used in this sixth embodiment is a reel-to-reel method. According to this reel-to-reel method, as shown in FIG. 20, a band-like wiring tape substrate 3 (multi-substrate tape) having semiconductor device-forming areas at predetermined intervals is unwound from a reel 45, then an assembling work is performed, including mounting of a chip 2 on each of the semiconductor device-forming areas and formation of solder salient electrodes 5, and the wiring tape substrate 3 is wound round a take-up reel 46. A reel 48 for cover tape may be used. In this case, a cover tape 47 is unwound from the cover tape reel 48 and the wiring tape substrate 3 is wound round the take-up reel 46 while sandwiching the semiconductor chip 2 in between the wiring tape substrate 3 and the cover tape 47, whereby products can be protected.

The structure of the multi-substrate tape (wiring tape substrate) is the same as that of the wiring substrate (wiring tape substrate) 3 used in the first embodiment. In the illustrated embodiment, a tape-like NCF is already affixed as adhesive 4 onto a main surface of the wiring tape substrate 3.

In FIG. 20, as assembling work stations, a chip bonding (chip mounting) station A, a ball affixing station B, and a ball reflow station C are arranged in the moving direction of the wiring tape substrate 3 (multi-substrate tape).

In the chip mounting station A, a semiconductor chip 2 is held by vacuum suction at a lower end of a collet 50 and the semiconductor chip 2 is fixed to a predetermined product-forming area on the wiring tape substrate 3. FIG. 21 is an enlarged schematic diagram showing in what state the semiconductor chip is mounted onto the wiring tape substrate. The semiconductor chip which has been carried by the collet 50 is brought down and fixed onto the product-forming area on the wiring tape substrate 3 in a state in which gold wire bump electrodes 20 stand face to face with the wiring tape substrate 3.

More specifically, as shown in FIG. 21, a thermosetting adhesive 4 constituted by NCF is affixed to an upper surface of the wiring tape substrate 3 on the stage 51. With descent of the collet 50, the gold wire bump electrodes 20 formed on a lower surface of the semiconductor chip 2 get into through holes (slots) 14 formed in the wiring tape substrate 3. At this time, tips of the gold wire bump electrodes 20 break through the adhesive 4 and come into contact with plating films 15 positioned at the bottoms of the slots 14. By pressing of the collet 50 against the stage 51 and by heating from the stage 51, etc. the gold wire bump electrodes 20 is connected to the wiring lines 11 through the plating films 15.

With the above heat and pressure, the adhesive 4 cures and thereby ensures positive bonding of the semiconductor chip 2 to the wiring tape substrate 3.

The connections of the wiring lines 11 exposed to the bottoms of the slots 14 formed in the wiring tape substrate 3 are each coated on the surface thereof with Sn or NI—Au plating film, so that the bonding between the gold wire bump electrodes 20 and the connections is Au—Sn (Au—Sn alloy) or Au—Au bonding. As is the case with the first embodiment, ACF is also employable as the adhesive 4.

In the ball affixing station B, plural metallic balls 56 are held in a matrix shape on a flat main surface of a ball supply jig 55. Though not shown, this holding operation is performed by vacuum suction through vacuum suction holes formed in the main surface of the ball supply jig 55. The vacuum suction holes are formed correspondingly to apertures 13 formed in the wiring tape substrate 3.

FIG. 22 is a schematic diagram illustrating a state of operation of the ball supply jig 55 which holds solder balls as metallic balls 56 by vacuum suction and supplies the solder balls to the wiring tape substrate 3. As shown in FIG. 22, the ball supply jig 55, with its main surface facing down, moves to the position above a ball supply box 57 which accommodates the metallic balls 56 and then moves down to a predetermined height. In this state, vacuum suction is performed to let the metallic balls 56 be held in the vacuum suction holes.

Next, the ball supply jig 55 rises, then moves leftwards, again moves down to a predetermined height, allowing the metallic balls 56 held by the ball supply jig 55 to be dipped into a flux solution 59 contained in a flux vessel 58 and coated with the flux solution.

Next, the ball supply jig 55 again rises to a predetermined height, then moves leftwards and stops just under the wiring tape substrate 3 (multi-substrate tape) which is at a standstill in the ball affixing station B. Thereafter, the ball supply jig 55 turns over 180° around a shaft 60 so that its main surface faces up. Next, the ball supply jig 55 rise to a predetermined height and supplies the metallic balls 56 held on its main surface to a lower surface of the wiring tape substrate 3. By utilizing the bonding force of the flux solution, the metallic balls 56 are bonded onto plating films 16 formed on the bottoms of the apertures 13 which are formed in the lower surface of the wiring tape substrate 3. Thereafter, vacuum suction is stopped and the ball supply jig 55 is moved down to a predetermined height.

In the next ball reflow station C, the metallic balls 56 thus bonded to the lower surface of the wiring tape substrate 3 are temporarily heated (reflowed) by means of upper and lower heaters 61. With this reflow, the metallic balls 56 soften and melt, whereby solder salient electrodes (area array bump electrodes) 5 are formed on surfaces of the wiring lines 11 with plating films 16 formed thereon.

The wiring tape substrate 3 with the semiconductor chip 2 mounted and the solder salient electrodes 5 formed thereon is then wound round the take-up reel 46 intermittently together with the cover tape 47. The resulting product is shipped in the state of the take-up reel 46, then on the user side the wiring tape substrate 3 is cut off and the semiconductor device 1 is removed.

As described above, in accordance with the reel-to-reel method there is made electric connection between the semiconductor chip and the wiring tape substrate, and in case of sealing the semiconductor chip with resin for protecting the main surface of the chip, there is used NCF. Thus, it is desirable to adopt means which uses a thermocompression-bonding jig through a thermosetting resin to mount the semiconductor chip onto the wiring tape substrate.

As means for mounting the semiconductor chip onto the wiring tape substrate there are known, for example, means wherein transfer molding is performed after wire bonding and means wherein there is made sealing with an under-fill resin after solder bump reflow packaging. However, no matter which means may be adopted, there arises the problem that it is difficult to take matching with another process which uses the reel-to-reel method.

In contrast therewith, the means which performs theremocompression-bonding with use of a thermosetting resin is advantageous in that not only it is easy to take matching with respect to, for example, process time in ball affixing and ball reflow process and assembling and construction, but also it is possible to prevent the occurrence of a connection defect.

(Seventh Embodiment)

Figure 23:
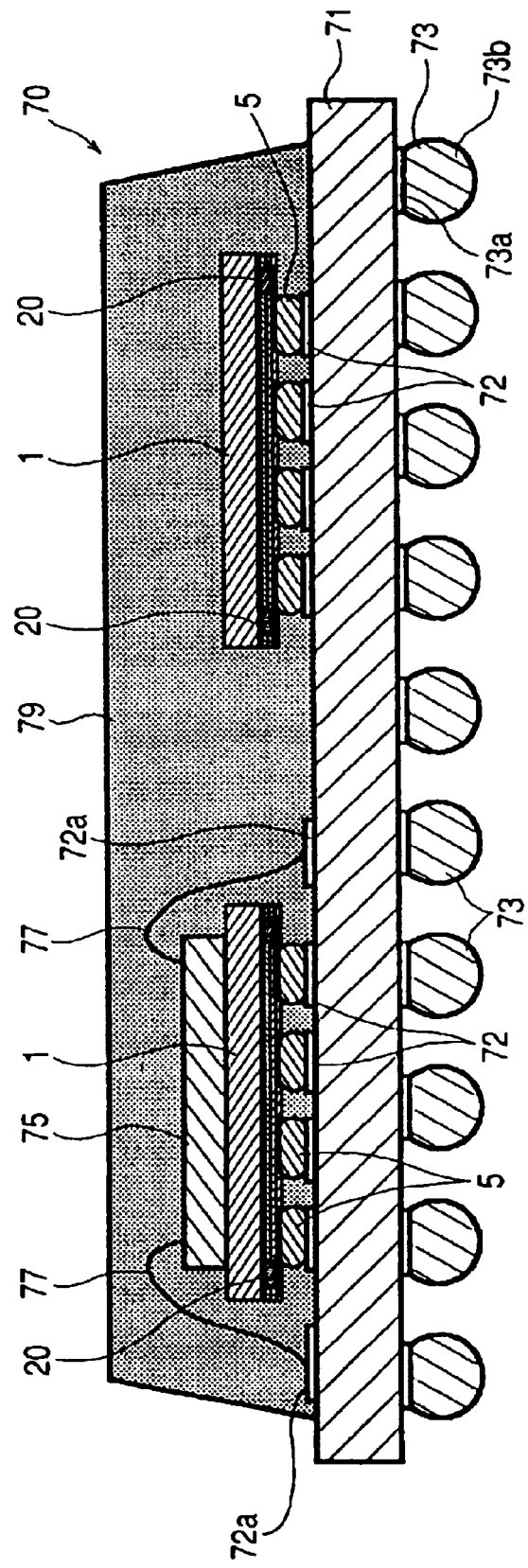
FIG. 23 is a schematic sectional view showing a multi-chip module according to a still further embodiment (seventh embodiment) of the present invention.
Figure 24:
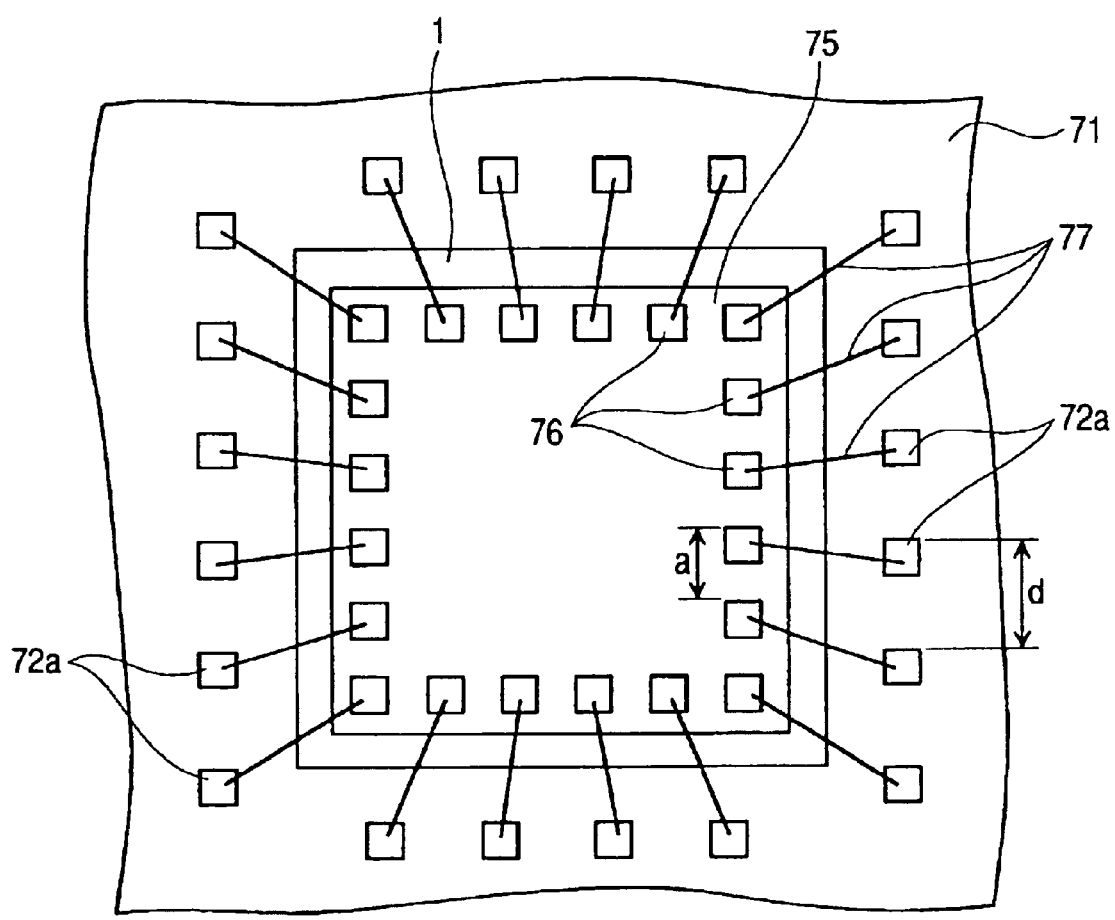
FIG. 24 is a schematic diagram showing an array of electrodes on a semiconductor element and an array of wire bonding pads on a multi-chip module substrate in the multi-chip module of the seventh embodiment.
Figure 25:
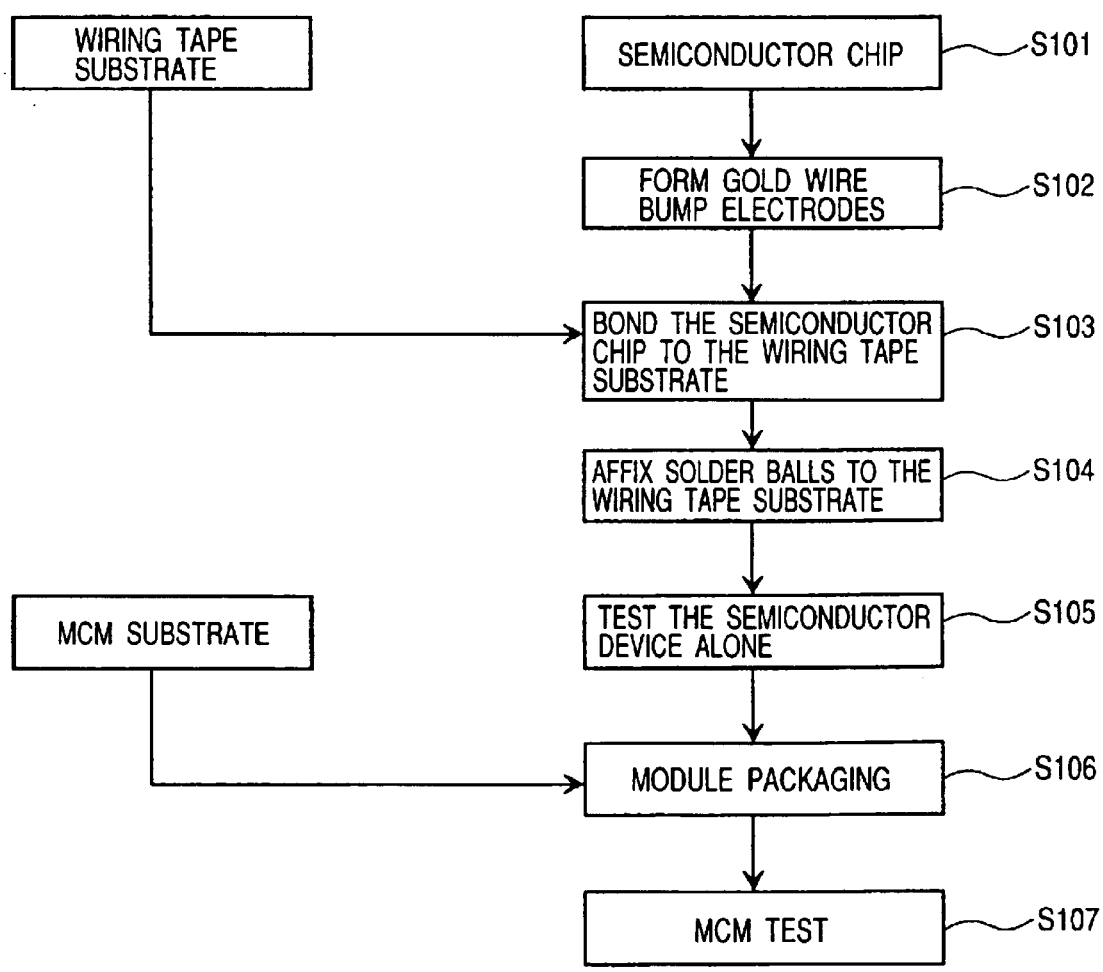
FIG. 25 is a flow chart showing a method of manufacturing the multi-chip module of the seventh embodiment.

FIGS. 23 to 25 are concerned with a semiconductor module (multi-chip module) according to a still further embodiment (seventh embodiment) of the present invention. As shown in FIG. 23 which is a schematic sectional view, the semiconductor module of this embodiment, indicated at 70, has an insulating module substrate 71. The module substrate 71 has plural connecting electrodes 72 on a main surface thereof and has plural external electrode terminals 73 on a back surface (lower surface in the figure) thereof. Though not shown, predetermined external electrode terminals 73 and predetermined connecting electrodes 72 are electrically connected with each other through conductors which extend through the interior of the module substrate 71. Each of the external electrode terminals 73 comprises a wiring line 73a formed on the back surface of the module substrate 71 and a bump electrode 73b formed on the wiring line 73a, and is thus BGA type.

The connecting electrodes 72 on the main surface of the module substrate 71 are arranged in a matrix shape (area array shape) correspondingly to the array of solder bump electrodes 5 on the semiconductor device 1 of the first embodiment so as to permit mounting thereon of the semiconductor device. Such a group of connecting electrodes 72 are provided in various portions of the module substrate 71 as necessary.

Outside a certain group of connecting electrodes 72, in other words, outside the matrix-arrayed connecting electrodes, there are provided connecting electrodes 72a in the form of a frame which electrodes 72a serve as wire bonding pads. In FIG. 23, the connecting electrodes 72a are arranged on the left-hand side.

The solder salient electrodes 5 on the semiconductor device 1 are fixed (face-down fixed) to the connecting electrodes 72 by reflow and the semiconductor device 1 is mounted on the module substrate 71. Further, a semiconductor element (semiconductor chip) 75 is fixed onto the left-hand semiconductor device 1 through an adhesive (not shown). As shown in FIG. 24, the semiconductor chip 75 has electrodes 76 on an exposed side thereof. The electrodes 76 and the connecting electrodes 72a on the main surface of the module substrate 71 are connected together through conductive wires 77.

It is optional whether the adhesive for fixing the semiconductor chip 75 is to be a conductive one or a non-conductive one. In case of using a conductive adhesive, if the substrate which constitutes the semiconductor chip 75 is silicon or a compound semiconductor, the substrate becomes equal in potential to the silicon substrate which constitutes the semiconductor chip 2 in the semiconductor device 1. Thus, according to the circuit configurations of the semiconductor chips 2 and 75, there sometimes is a case where both can be made common to each other in GND potential.

As shown in FIG. 24, the plural connecting electrodes 72a to which the wires 77 on the main surface of the module substrate 71 are connected have a larger pitch (d) than a minimum pitch (a) of plural electrodes 76 formed on the main surface of the semiconductor chip 75, thus providing a re-wiring structure.

As described in the first embodiment, the plural solder salient electrodes 5 are arranged in a lattice shape comprising plural rows and columns at a larger pitch than the minimum pitch of electrodes 6 on the semiconductor chip 2, thus also providing a re-wiring structure. These re-wiring structures make it easier to mount the semiconductor chip.

The following structural characteristics are as described in the first embodiment. The sum of the thickness of an insulating base layer (tape base) 10 in the semiconductor device 1 and the thickness of an adhesive 4 is 50 to 100 $\mu$m, the thickness of the insulating base layer in the semiconductor device 1 is larger than that of the adhesive 4, and the thickness of the adhesive 4 in the semiconductor device 1 is equal to or less than 50 $\mu$m. On a main surface of the insulating base layer of the semiconductor device 1 is formed an insulating film (solder resist) 12 which covers a part of wiring lines 11, and the thickness of the insulating base layer 10 is larger than the thickness of the insulating film 12. Further, the elastic modulus of gold salient electrodes (gold wire bump electrodes) 20 on the semiconductor device 1 is larger than the elastic moduli of the insulating base layer 10 and the adhesive 4. Also in the semiconductor module 70 these structural characteristics bring about the same effects as in the semiconductor device 1.

On the main surface side of the module substrate 71 there is formed a sealing member 79 of an insulating resin by one-side molding in accordance with transfer molding. The semiconductor device 1, semiconductor chip 75, connecting electrodes 72, 72a, and wires 77 are completely covered with the sealing member 79.

The semiconductor module 70 of this seventh embodiment is fabricated in accordance with the flow chart of FIG. 25. As shown in the same flow chart, though not illustrated diagrammatically, a semiconductor chip 75 is provided (S101), then gold wire bump electrodes 20 are formed on electrodes of the semiconductor chip (S102), and the semiconductor chip 2 is bonded to a wiring tape substrate 3 (S103).

Next, metallic balls (solder balls) are affixed to predetermined positions of the wiring tape substrate 3 (S104) and thereafter the semiconductor device alone is tested (test the semiconductor device alone: S105).

Then, a module substrate 71 is provided, thereafter the semiconductor device 1 and the semiconductor chip 75 are mounted on this MCM substrate, and electrodes 76 of the semiconductor chip 75 and connecting electrodes 72a are connected with each other through wires 77. Further, a sealing member 79 is formed by one-side molding to cover the semiconductor device 1, semiconductor chip 75, connecting electrodes 72, 72a and wires 77, to complete module packaging (S106). Then, a semiconductor module 70 thus fabricated is tested (S107) and defective products are removed, while non-defective products are shipped.

In forming MCM (MCP: Multi-Chip Package), stacking semiconductor chips is effective for the reduction in size of MCP. In case of stacking semiconductor chips, it is advantageous to adopt a method a face-down packaging method wherein an underlying chip is connected to a module substrate through salient electrodes. This is because, in comparison with the case where an underlying chip is mounted face up and wire bonding is performed, there are less restrictions on the size of the semiconductor chip and the layout of electrodes formed on the main surface of the semiconductor chip, thus affording a package form of a higher degree of freedom.

As to the semiconductor chip to be face-down-packaged, it is effective to form salient electrodes on the basis of the package form according to the present invention.

More particularly, if there is adopted a bare chip packaging method wherein salient electrodes are formed directly on electrodes (bonding pads) formed on the main surface of the semiconductor chip to be face-down-packaged and the chip is connected onto a module substrate through those salient electrodes, the spacing of the salient electrodes is restricted by the spacing of the electrodes formed on the semiconductor chip and is apt to become narrow. Consequently, it is necessary to provide a module substrate having such a high dimensional accuracy as permits formation of fine wiring lines, with a consequent rise in unit price of parts giving rise to the problem that the module cost becomes very high.

In the case where a wafer level package product (WPP product: Wafer Process Package product) is adopted as the semiconductor chip to be face-down-packaged, the unit price required for the packaging process applied to defective chips is added to the unit price of non-defective chips, so that the resulting rise in unit price of parts also causes the problem of increase of the module cost.

In contrast therewith, the semiconductor module according to the present invention is kept low in its cost and is advantageous in that when semiconductor chips are stacked within a package, it is also possible to attain the reduction of wall thickness which is required of individual semiconductor chips.

Although the present invention has been described above concretely by way of embodiments thereof, it goes without saying that the present invention is not limited to the above embodiments, but that various changes may be made within the scope not departing from the gist of the invention.

The following is a brief description of effects obtained by typical modes of the invention disclosed herein.

(1) The wire bonding electrodes arranged along the peripheral edges of a semiconductor chip can be made into area array bump electrodes of a larger pitch than the pitch of the wire bonding electrodes with use of a wiring tape substrate, so that electric characteristics can be improved. Particularly, the inductance which is essential to high-speed signal processing can be decreased to about 0.1 nH from that in the wire bonding method which is 1 to 1.5 nH.

(2) By making the wire bonding electrodes into area array bump electrodes larger and wider in pitch than the wire bonding electrodes, it is possible to enhance the connection reliability at the time of packaging the semiconductor device.

(3) Since the wiring tape substrate with area array bump electrodes formed thereon is of the same size as the semiconductor chip and is superimposed on the semiconductor chip in registration with the chip, it is possible to attain the reduction in size of the semiconductor device.

(4) Since plural semiconductor chips of different types can be mounted to one and same wiring tape substrate, it is possible to attain an MCM structure of the semiconductor device.

(5) Since external connecting electrodes are arranged in area array, the electrode pitch on a packaging substrate for the semiconductor device can also be made large and thus it is possible to use a conventional inexpensive insulating substrate (organic substrate) fabricated by the laminate method.

(6) Further, the semiconductor device is of a real chip size and is reduced in size and weight, thus permitting flip-chip packaging and high-speed signal transmission. Consequently, its application to a portable device or a communication device can be expected.

(7) It is possible to provide a semiconductor device which has a stress relaxing structure between bump electrodes arranged in a lattice shape and a semiconductor chip, as well as a method of manufacturing the same.

(8) It is possible to provide a semiconductor module (multi-chip module) which can attain high-speed signal processing, high function, high-density packaging, and reduction of thickness and weight.

Industrial Applicability

As set forth above, the semiconductor device according to the present invention is useful for controlling an electronic device and for memory and is suitable particularly for the attainment of high-speed signal processing, high function, high-density packaging, and reduction of thickness and weight.

What is claimed is:

1. A method of manufacturing a semiconductor device, comprising the steps of:
   providing a semiconductor chip including a main surface, a plurality of semiconductor elements formed over the main surface, and a plurality of electrodes;

providing a wiring substrate including a flexible filmy insulating base layer provided with a main surface and a back surface, a plurality of wiring lines formed over the main surface of the insulating base layer, and through holes formed in the insulating base layer;

forming gold salient electrodes respectively over the electrodes of the semiconductor chip;

disposing the wiring substrate over the main surface of the semiconductor chip through an adhesive interposed between the back surface of the insulating base layer and the main surface of the semiconductor chip;

thereafter, applying pressure to the wiring substrate to bring the gold salient electrodes and the wiring lines into mutual contact in the interiors of the through holes, and applying heat to the adhesive to let the adhesive cure; and forming a plurality of solder salient electrodes over the main surface of the wiring substrate in such a manner that the solder salient electrodes are connected to the plural wiring lines, wherein the plural solder salient electrodes are arranged in a lattice shape of plural rows and columns at a pitch larger than a minimum pitch of the electrodes of the semiconductor chip, and wherein the solder salient electrodes are arranged over the main surface of the semiconductor chip through the adhesive and the insulating base layer.

2. A method of manufacturing a semiconductor device according to claim 1, wherein the adhesive is a thermosetting resin.

3. A method of manufacturing a semiconductor device according to claim 1, wherein the elastic modulus of the gold salient electrodes is higher than the elastic moduli of the insulating base layer and the adhesive.

* * * * *